(12) United States Patent
Aksenov et al.

(10) Patent No.: US 7,381,311 B2
(45) Date of Patent: Jun. 3, 2008

(54) FILTERED CATHODIC-ARC PLASMA SOURCE

(75) Inventors: Ivan I. Aksenov, Kharkov (UA); Volodymyr E. Strelnytskiy, Kharkov (UA); Volodymyr V. Vasylyev, Kharkov (UA); Andrey A. Voevodin, Dayton, OH (US); John G. Jones, Dayton, OH (US); Jeffrey S. Zabinski, Yellow Springs, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 759 days.

(21) Appl. No.: 10/693,482

(22) Filed: Oct. 21, 2003

(65) Prior Publication Data
US 2007/0187229 A1    Aug. 16, 2007

(51) Int. Cl.
*C23C 14/32* (2006.01)
(52) U.S. Cl. ............................. 204/192.38; 204/298.41
(58) Field of Classification Search ........... 204/192.38, 204/298.41
See application file for complete search history.

(56) References Cited

U.S. PATENT DOCUMENTS

| | | | |
|---|---|---|---|
| 4,452,686 A | 6/1984 | Axenov et al. ............. 204/298 |
| 4,551,221 A | 11/1985 | Axenov et al. ............. 204/298 |
| 5,221,902 A | 6/1993 | Jones et al. ................. 324/318 |
| 5,279,723 A | 1/1994 | Falabella et al. ...... 204/192.38 |
| 5,282,944 A | 2/1994 | Sanders et al. ........ 204/192.38 |
| 5,433,836 A | 7/1995 | Martin et al. .......... 204/298.41 |
| 5,435,900 A | 7/1995 | Gorokhovsky ......... 204/298.41 |
| 5,486,697 A | 1/1996 | Stalder et al. .............. 250/305 |
| 5,840,163 A * | 11/1998 | Welty .................... 204/192.38 |
| 6,026,763 A | 2/2000 | Kim et al. ............. 118/723 HC |
| 6,103,074 A | 8/2000 | Khominich ............ 204/192.38 |
| 6,504,149 B2 | 1/2003 | Guevremont et al. ....... 250/286 |
| 2002/0007796 A1 | 1/2002 | Gorokhovsky ........ 118/723 ER |
| 2002/0139662 A1* | 10/2002 | Lee ........................ 204/192.38 |

OTHER PUBLICATIONS

Anders, A. , Vacuum Technology and Coating, Jul. 2002, pp. 27-35.
D.A. Karpov, "Cathodic Arc Sources and Macroparticle Filtering", Surface Coatings and Technology, 1997, pp. 22-33, vol. 96, Elsevier.

* cited by examiner

*Primary Examiner*—Rodney G. McDonald
(74) *Attorney, Agent, or Firm*—AFMCLO/JAZ; Gerald B. Hollins

(57) ABSTRACT

A filtered cathodic-arc plasma source of lower plasma losses and higher output plasma current to input current efficiency is disclosed. Plasma filtering is accomplished in a right angle bend magnetic filter arranged to include the effects of at least three added magnetic coils located at the right angle bend of the filter path. These magnetic coils and other filter attributes, including an array of transverse fins and a magnetic cusp trap in the filter path, achieve desirable magnetic flux paths, lower plasma collision losses and reduced undesired particle output from the plasma filter. Multiple cathode sources, multiple plasma output ports, Larmour radius influence, equipotential magnetic flux lines and electron/ion interaction considerations are also included in the plasma source. Application of the plasma source to film coating processes is included.

31 Claims, 21 Drawing Sheets

FILTERED CATHODIC-ARC PLASMA SOURCE

RIGHTS OF THE GOVERNMENT

The invention described herein may be manufactured and used by or for the Government of the United States for all governmental purposes without the payment of any royalty.

BACKGROUND OF THE INVENTION

This invention concerns ion-plasma treatment of materials and, more particularly filtered high quality cathodic-arc plasma sources usable for such treatment.

Vacuum-arc methods of coating deposition and surface modification have gained wide recognition in recent decades for use in for example tool production, mechanical engineering and instrument making. These processes form desirable coatings and surface layers that cannot be produced by other known methods. The essence of and the areas of application of vacuum-arc coating formation and surface modification have been described for example in the technical journal articles "Principles and Applications of Vacuum Arc Coatings" by R. L. Boxman, IEEE Transactions on Plasma Science, Volume 17, Number 5, October 1980 and in "Metal Plasma Immersion Ion Implantation and Deposition: a Review" by A. Anders, Surface and Coating Technology, 93 (1997) pages 158-167.

The presence of macroparticles of cathode material in cathodic-arc plasma often deteriorates the quality of a synthesized coating and a surface treated in this manner. This deterioration in fact hinders an even wider application of the vacuum arc technology. This deterioration especially affects such demanding applications as microelectronics, optics, fine mechanics, and medicine (e.g. surgical instrument sets and prosthetics). Problems associated with macroparticle generation and transport, and also methods of suppressing macroparticle flow between the cathode of an arc source and the treated surface have been considered in the published article "Macroparticle Contamination in Cathodic Arc Coating: Generation, Transport and Control" by R. L. Boxman and S. Goldsmith, Surface and Coating Technology, 52 (1992) p. 39-50. The Boxman et al. and each of the other references, including patent documents, identified in this disclosure are hereby incorporated by reference herein.

Magnetic filters currently provide the most efficient cleaning of the plasma generated in vacuum-arc cathode spots. The action of these filters is based on spatial separation of the trajectories of plasma components i.e., separation of ions and macroparticles. Between the substrate or work piece (the object to be treated) and the active cathode surface, which emits plasma flow inclusive of macroparticles, an obstacle is installed to exclude the direct line-of-sight between the cathode and the substrate. A special screen or the walls of a bent tubular plasma duct can serve as this obstacle. In such systems, ions are bypassed around the obstacle to the output of the system, and further, to the substrate using electromagnetic field guidance. Heavy and weakly charged macroparticles and neutral atoms are however intercepted by the screen or plasma duct walls, since they are less responsive to magnetic and electric fields and tend to move in rectilinear trajectories.

A known cathodic-arc plasma source comprises a cylindrical or conical cathode with a working end surface evaporated by the cathode spot of an arc, a tubular cylindrical anode and a cathode coil that surrounds the cathode and generates a magnetic field confining the cathode spot on the working end of the cathode. This source also includes an anode magnetic coil serving to magnetically focus the plasma stream emitted by the cathode spot. An apparatus of this type is shown in the I. I. Axenov (Aksenov) et al., U.S. Pat. No. 4,551,221 of 1985. In this source, substantially the whole ion component is directed by the focusing magnetic field to the source output, and the macroparticles, which move mainly in the radial direction, are intercepted by the anode walls, so that the macroparticle concentration in the output plasma flow is substantially reduced with respect to plasma sources having no focusing magnetic coil.

A more effective suppression of macroparticle flow is ensured when a screen is placed on the axis of the tubular anode or the plasma duct to intercept the part of macroparticle flow moving along the device to its output; this arrangement is shown in the I. I. Axenov (Aksenov) et al., U.S. Pat. No. 4,452,686 of 1984. The output of the useful (ion) plasma component is however moderate in this device because of great ion losses on the incorporated screen.

Cathodic-arc filtered-plasma sources, wherein macroparticles are removed from an erosion plasma as it travels along a curvilinear plasma duct have gained the widest recognition in production practice, see I.I. Aksenov et al., "Transport of Plasma Stream in a Curvilinear Plasma-Optics System", Soviet Journal of Plasma Physics 4 (4), 1978, p 425-428. In these devices, charged particles, i.e., electrons and ions, are transported along the plasma duct by the magnetic field of magnetic coils arranged evenly over the plasma duct length. In contrast the heavy and weakly charged macroparticles, being unresponsive to magnetic and electric fields, and moving by inertia in straight-line trajectories, inevitably encounter the plasma guide channel walls. After collision with a channel wall however a considerable number of macroparticles do not stick to the wall and may maintain some kinetic energy even after a few collisions. As a result, an appreciable part of the rebound macroparticles may arrive at the exit port of the plasma duct and thus at the work piece or substrate. The number of rebounding macroparticles at the output of the plasma duct is significantly reduced when intercepting screens (e.g., a set of plane fins) are arranged on the plasma duct walls to serve as traps of macroparticles.

The efficiency of macroparticle removal with a curvilinear magnetic filter can be improved by lengthening the plasma-guiding channel, or by decreasing its width and/or increasing the total bend angle of the channel [see Xu Shi et al., "Filtered Cathodic Arc Source", International Patent Application No. PCT/GB/00389, Int. Pub. No. WO 96/26531; S. Anders et al., "S-shaped Magnetic Macroparticle Filter for Cathodic Arc Deposition", Proc. XVIIth International Symposium on Discharges and Electrical Insulation in Vacuum, Berkeley, Calif., Jul. 21-26, 1996, p.904]. In these systems however, the losses of the ion component are increased and the throughput of the plasma stream is significantly decreased. The productivity of such systems is reduced, while design complexity and, correspondingly, costs are increased. As a result, the applicability of these systems in the coating production practice is rather limited.

Other known plasma arrangements attempt to improve the efficiency (maximize throughput of the plasma stream and minimize macroparticle transport) of the curvilinear plasma filters and simplify their design. For example, V. I. Gorokhovsky in U.S. Pat. No. 5,435,900, 1995, teaches minimizing the length of the plasma guiding channel with a relatively great cross-sectional area, while S. Falabella et al., in U.S. Pat. No. 5,279,723, 1994 teaches use of a simple magnetic system in the form of two magnetic coils embracing two straight tubular plasma ducts, that are joined at 45° to each other. These simplifications in filter design are not however accompanied by an adequate improvement of the filter efficiency. This is explained by the fact that such simplification of the magnetic filter system deteriorates the transport properties of the magnetic field itself. This deterioration is especially notable where regions with high longitudinal and transverse field gradients appear. Such gradients act as magnetic "mirrors" and hinder plasma passage along the system. Another negative consequence of these simplifications is a degradation of the particle filtering efficiency.

Another known cathodic-arc plasma source comprises a cylindrical cathode with an end working surface; a tubular anode coaxial with the cathode; a plasma duct, electrically insulated from the anode and forming together with the anode a curvilinear plasma-guiding channel bent at 45°. This source includes electromagnetic coils embracing the cathode, the anode and the plasma duct and arranged along the whole plasma-guiding duct; see the P. J. Martin et al., U.S. Pat. No. 5,433,836, 1995. Such a moderate bend angle with magnetic field uniformly distributed along the channel provides a fair efficiency of the ion component. passage through the filtering channel i.e., the output of the ion flow is up to 2.5 Amperes measured at the filter exit with a cathode arc current of 100 Amperes. A further improvement in filter efficiency is hindered by ion losses on the duct walls due to the plasma flow displacement as a result of centrifugal and gradient drifts. Such drifts always accompany plasma passage along a curvilinear inhomogeneous magnetic field. Thus, the major part of the plasma losses occur in the curvilinear part of the plasma-guiding duct by way of the ion component drifting to the duct walls.

There are filter arrangements providing a partial compensation of the drifts during the plasma passage along the filtering plasma-guiding ducts. For example, Kim et al., U.S. Pat. No. 6,026,763 teaches the placement of additional electromagnetic coils on the convex side of the bent part of the plasma duct to repel drifted ions from the duct wall. Additionally, Gorokhovsky, U.S. Patent Application Publication No. U.S. 2002/0007796A1, 2002 teaches the placement of additional plate-shaped electrodes inside the plasma duct and use of a positive bias voltage applied to the electrodes from an individual power source to counteract ion drift. These measures however, do not provide desirable filter efficiency. Furthermore, they considerably complicate the filtering system, eliminating previous attempts toward filter simplification.

In addition none of the known filtered cathodic-arc plasma sources can provide a plasma stream of complex, i.e., multi component, composition, nor can these sources provide a uniform distribution of component concentrations in the plasma cross section, when mixing plasma streams emitted simultaneously by two and more vacuum arc plasma sources. In the known devices [i.e., U.S. Patent Application Publication No. U.S. 2002/0007796A1, 2002], the plasma generated by two sources with different evaporated cathode materials is transported in one plasma duct, but using two parallel paths displaced with respect to each other in space. As a result, the distribution of cathode material concentration in the cross section of the total plasma stream and, therefore, over the substrate surface located at the filter exit is not uniform.

The present invention is believed to provide assistance with respect to several of the difficulties identified in these discussions of known filtered cathodic-arc plasma sources. The achievement of improved plasma filter input to output current efficiencies is a particular aspect of the invention.

SUMMARY OF THE INVENTION

The present invention provides ion-plasma treatment of materials and, more particularly an improved cathodic-arc filtered plasma source for such treatment.

It is therefore an object of the invention to provide a source of high quality filtered cathodic-arc plasma.

It is another object of the invention to provide a source of high quality filtered cathodic-arc plasma in which the plasma filter operates at improved ion transmission efficiency.

It is another object of the invention to provide a filtered plasma source having lower plasma filtering losses.

It is another object of the invention to provide a filtered plasma source having lower plasma drift losses than other sources employing filters of the ninety-degree bend type.

It is another object of the invention to provide a filtered plasma source having an included trap for macro particles.

It is another object of the invention to provide a filtered plasma source useful in the deposition of quality coatings such as wear-resistant, anti-friction, corrosion-resistant, erosion-resistant, optical, decorative, electrically conductive and electrically insulating coatings.

It is another object of the invention to provide a filtered plasma source usable for surface modification of materials through irradiation with fluxes of electrons, metal and gas ions.

It is another object of the invention to provide a filtered plasma source having a significant decrease in the plasma drift losses in the curvilinear part of the plasma-guiding duct.

It is another object of the invention to provide a filtered plasma source having a high degree of plasma filtering from macroparticles ejected from the evaporated cathode surface.

It is another object of the invention to provide a filtered plasma source capable of plasma streams of complex composition and uniform distribution of component concentrations, when plural cathodic-arc plasma generators and different cathode materials are used.

It is another object of the invention to provide a filtered plasma source employing first and second correcting coils embracing the plasma duct.

It is another object of the invention to provide a filtered plasma source that is also usable in for example surface modification of materials, electron heating, ion etching, surface saturation, plasma immersion and ion implanting operations.

It is another object of the invention to provide a filtered plasma source that is usable in either laboratory or manufacturing settings.

Additional objects and features of the invention will be understood from the following description and claims and the accompanying drawings.

These and other objects of the invention are achieved by purified cathodic arc plasma source apparatus comprising the combination of:

a cathode arc source of electrons, ions and additional cathode arc generated particles;

an input duct element disposed in axial communication with said cathode arc source of electrons, ions and additional cathode arc generated particles;

a first input duct electrical magnetic coil disposed surrounding said input duct element and energized by a source of selected magnitude direct current electrical energy;

an output duct element disposed in substantially orthogonal communication with a downstream portion of said input duct element and with input duct element electrons and ions influenced by said first input duct electrical magnetic coil;

an output electrical magnetic coil disposed surrounding said output duct element and energized by a source of selected magnitude direct current electrical energy;

a second input duct electrical magnetic coil disposed surrounding said input duct element in an input duct location downstream of said output duct element and energized by a source of selected magnitude direct current electrical energy;

a first saddle shaped ion path correcting magnetic coil disposed surrounding said input duct element in a downstream location preceding said output duct element and partially surrounding said output duct element adjacent said input duct element;

a second saddle shaped ion path correcting magnetic coil disposed surrounding said input duct element in a downstream location succeeding said output duct element and partially surrounding said output duct element adjacent said input duct element

BRIEF DESCRIPTION OF THE DRAWINGS

The above objects and advantages of the invention will become more apparent by describing preferred embodiments thereof with reference to the attached drawings in which.

DETAILED DESCRIPTION

Overview

Figure 1:
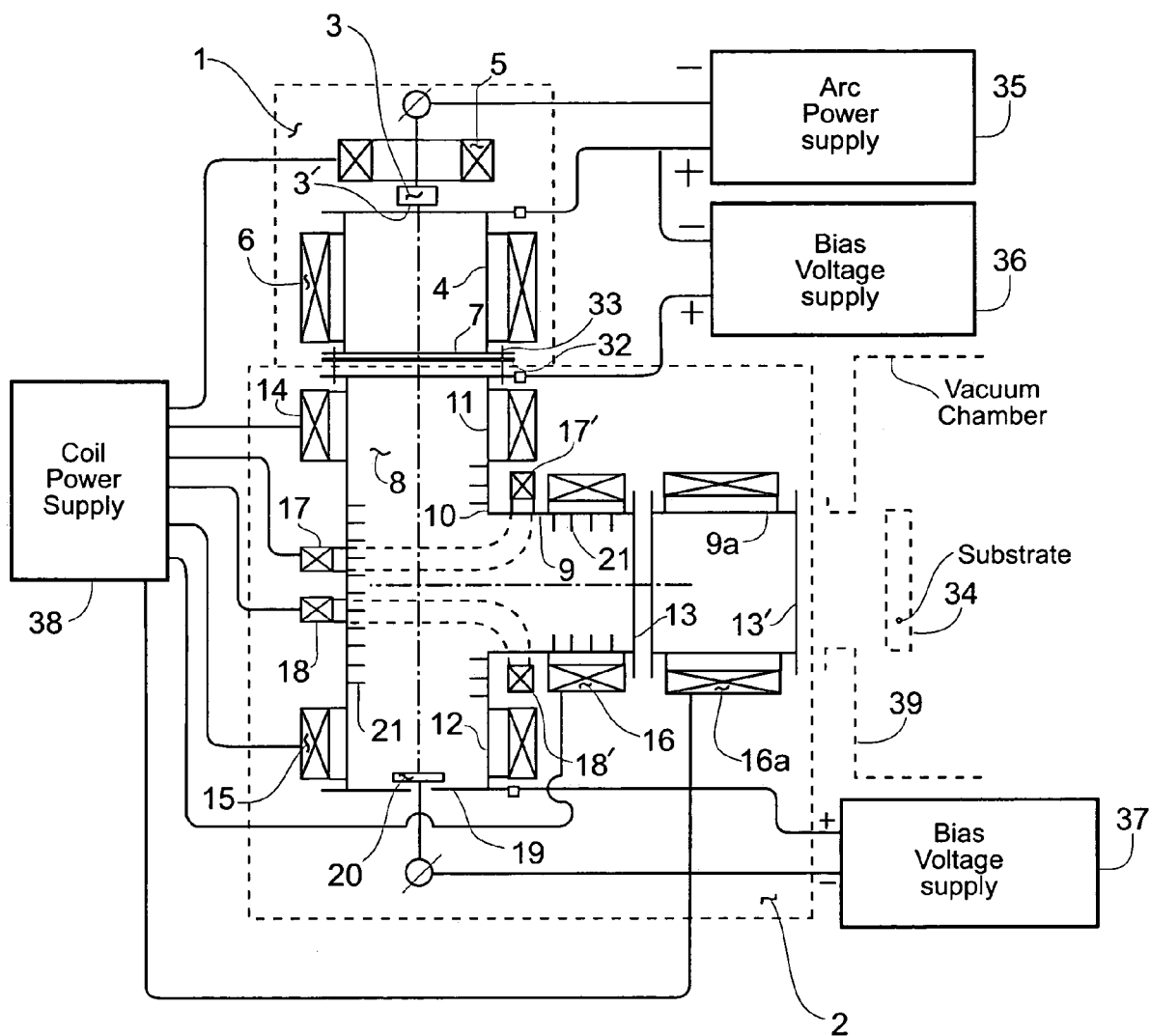
FIG. 1 shows a schematic drawing of a filtered cathodic-arc plasma source according to the present invention using one plasma generator and two correcting magnetic coils.

The following several paragraphs describe the present invention in largely reference number-free text. Following this primarily word description is a more conventional significantly drawing-referenced discussion.

In the present invention a consumable cathode with a working surface being evaporated under the action of a vacuum-arc cathode spot, and thus emitting a cathode material plasma flow, is combined with a tubular anode arranged opposite the working surface of the cathode and with magnetic coils embracing the cathode and anode to form a plasma generator. This generator is further combined with a plasma filter that has rectilinear tubular plasma ducts forming a curvilinear plasma-guiding channel and having at least one outlet port. The plasma filter excludes direct line of-sight paths between the outlet port and the cathode of the plasma generator. The vacuum arc and the magnetic coils are energized by independent power sources. The plasma-guiding channel serves to transport plasma from the plasma generator to the filter outlet port and to a substrate work piece arranged opposite the port opening, and also to absorb the emitted macroparticles of the cathode material. The plasma filter also includes magnetic coils embracing the plasma ducts and serving to generate a composite magnetic field directing plasma ions and electrons along the plasma-guiding channel to the work piece substrate.

In further accordance with the invention an outlet plasma duct is connected, preferably at a right angle, to the input plasma duct and thus with the plasma generator. Moreover the plasma duct input and output cavities are interconnected via an opening in the wall of the input plasma duct. The site of the opening in the wall of the input plasma duct divides the input plasma duct into two sections: one facing the anode of the plasma generator, and the other, a macroparticle trap region, extending beyond the site of the opening in the wall of the input plasma duct. The first section of the input plasma duct together with the output plasma duct form a plasma-guiding channel to transport plasma from the plasma generator to the outlet port of this channel and to the work piece substrate arranged opposite the outlet port.

The first section and the second section of the input plasma duct are encircled with first and second input magnetic coils, respectively; and on the output plasma duct there is an output magnetic coil. The output magnetic coil is connected to a power source so that the current in its turns generates a magnetic field in the output plasma duct, the lines of this magnetic field being a continuation of the field lines of the first input magnetic coil. Between the first and second input magnetic coils there is disposed a means to adjust the magnetic field in the form of first and second correcting magnetic coils that embrace the input plasma duct adjacent the output plasma duct at locations near the first and second input magnetic coils respectively. The correcting coils are located preferably in the immediate vicinity of each other, and their portions on the side of the output plasma duct are bent back to opposite flare directions to embrace the output plasma duct around its periphery. These correcting magnetic coils are connected to a power source in such a way that electrical currents generate a same magnetic polarity flow in the first input magnetic coil 14 and first correcting coil 17, and also a same magnetic polarity flow in the second input magnetic coil 15 and second correcting coil 18.

An output duct entrance magnetic coil is placed adjacent the input plasma duct, preferably coaxially with the output plasma duct and the output magnetic coil, and serves as an additional component of the means for magnetic field adjustment. The average diameter dimension of the output duct entrance magnetic coil is made no less than the diameter of the input plasma duct and no larger than its length. The magnetic field strength desired in the output duct entrance magnetic coil and in the correcting magnetic coils is preferably selected by experimentation. Such experimentation can of course determine desired magnetic field strength as well as the related tradeoff quantities of magnetic coil winding turns and operating current level. One possible "bottom line" function of these magnetic coils is the correction of magnetic fields in the filter in order to generate maximum ion current flow at the filter output port.

The present invention also provides another arrangement of the cathodic-arc plasma source, an arrangement wherein magnetic coils are connected to a power source so that the current direction in the turns of the first input magnetic coil and the first correcting magnetic coil are made opposite to the current direction in the turns of the second input magnetic coil and the second correcting coil. In this arrangement of the plasma source there is generated a region with minimum magnetic field strength at the intersection of the plasma ducts. The magnetic field lines coming into this region from two opposite sides in fact diverge here in a fan-like manner and form a narrow circular magnetic slit, a narrow long opening that widens on the side of the output plasma duct. The plasma arriving at the region with this magnetic field configuration leaves the region through this widening circular magnetic slit. The remaining narrower part of the slit and the axial channel (along the second section of the input plasma duct) reflect the plasma like magnetic mirrors. The plasma losses arising from plasma escape through these "mirrors" are substantially compensated by the absence of drift (both gradient and centrifugal drift) losses in this system. A lower ion energy in the output plasma flow is an advantage of this second arrangement; this is desirable in cases where the source is used in the treatment of materials having a low energy threshold of performance modification e.g. heat sensitive materials.

To improve the efficiency of plasma ion passage through the plasma-guiding channel of present invention apparatus, it is expedient to place an insulated electrode, e.g., in the form of a plate, in the end of the second section of the input plasma duct, this electrode overlapping the central part of the plasma duct end. A negative floating potential applied to this electrode serves as a barrier for electron escape from the plasma guiding system. This favors a buildup of a space charge of electrons, an increase in the ion density in the plasma-guiding channel and more efficient passage of desired plasma to the exit port of the system.

To form a filtered plasma flow comprising ions of two different materials, and to increase the intensity of the output plasma flow, a second plasma generator may be connected to the end of the second section of the input plasma duct in the present invention plasma source. Depending on the need at hand, the cathodes of the two plasma generators may be made from one and the same material or from different materials. In the formation of such two-component plasma flows, the ratio of plasma component concentrations is determined by the relationship of discharge currents in the plasma generators i.e., in the plasma generating arcs. A uniform distribution of each component of the plasma flow at the exit port of the system is provided by an intense mixing of the primary flows meeting in the region of the magnetic field minimum discussed above.

To improve the efficiency of plasma passage through the filtering plasma-guiding duct of the present invention plasma source in any of the above-considered arrangements, it is desirable to dispose a transverse slit in the wall of the input plasma duct between its first and second sections, a slit closed on its outside by a screen electrically insulated from the plasma duct. The desired position of this slit coincides with the magnetic slit position in the fields generated by the first and second input magnetic coils. A negative floating potential achieved on the screen favors a buildup of the space charge of electrons, an increase in the ion density in the plasma duct and more efficient ion motion to the exit port of the system.

The present invention also involves a version of the filtered plasma source, in any of the above-considered arrangements, which includes an output duct entrance magnetic coil arranged close to the input plasma duct opposite to the output plasma duct and coaxially with the output plasma duct. This output duct entrance magnetic coil is connected to a power source in such a way that the magnetic field generated by it is directed against the field generated by the output magnetic coil. In this arrangement the magnetic field between the oppositely connected input magnetic coils achieves a high symmetry owing to increased field strength in the magnetic slit in front of the output magnetic coil and owing to a displacement of the field minimum region to the center of the system. In its turn, this reduces the plasma losses due to departure of plasma to the back wall of the input plasma duct (opposite the output plasma duct), and therefore, increases the efficiency of plasma transport to the exit port of the system. The beneficial effect of this output duct entrance magnetic coil is achieved when the coil aperture dimension is made no less than the diameter of the input plasma duct and no more than the length of the input plasma duct.

A further arrangement of the present invention filtered cathodic-arc plasma source differs from the arrangements disclosed thus far in that the plasma filter used comprises an additional plasma duct joined to the input plasma duct opposite to the output plasma duct and coaxially with the output plasma duct. In this case, the segments of the first correcting magnetic coil and the second correcting magnetic coil on the side of the additional plasma duct, i.e., the second output plasma duct, are bent back to opposite duct-orthogonal directions so that each of them bends around the additional plasma duct along its perimeter. The additional plasma duct is also provided with an output duct entrance magnetic coil, which is connected to a power source in such a way, that the magnetic field generated by it is directed opposite to the field generated by the output magnetic coil. In this arrangement there exists the possibility of forming two output filtered-plasma flows directed to opposite directions. To provide the possibility of forming a filtered cathodic-arc plasma flow of complex (e.g., two-component) composition, an additional filtered plasma source in one of the above considered arrangements may be joined to the additional plasma duct.

According to a further arrangement of the invention one or two filtered plasma sources may be connected, respectively, to one or two ends of the input plasma duct. In this arrangement the possibility of forming filtered cathodic-arc plasma flows containing several plasma components is achieved together with a higher degree of removal of macroparticles from the formed flow. Additionally a uniform ratio of component concentrations in the cross section of the flow is possible and an increased intensity of the filtered plasma flow is achieved.

Formalized Description

With the preceding general word descriptions of the several arrangements of the invention in mind it is believed now possible to appreciate the following more detailed descriptions of the invention. Accordingly, the filtered cathodic-arc plasma source shown in the drawing of FIG. 1 comprises a plasma generator 1 and a plasma filter 2. The plasma generator 1 comprises a cylindrical consumable cathode 3 with an evaporable end surface 3 (later called a "working surface"), a tubular anode 4, placed opposite the working surface 3 of the cathode 3, and also a cathode magnetic coil 5 and an anode magnetic coil 6. The cathode magnetic coil 5 and anode magnetic coil 6 attend or embrace respectively the cathode 3 and the anode 4. An input plasma duct 8 matched with an output plasma duct 9 is connected to the output end 7 of the tubular anode 4 via an insulator 32 and insulated threaded members 33.

The plasma duct cavities are interconnected thorough an opening 10 in the wall of the input plasma duct 8. The opening 10 serves as an inlet opening of the output plasma duct 9. The site of the plasma ducts junction divides the input plasma duct 8 into two sections: the first section 11 facing the anode 4, and the second section 12 being on the downstream or opposite side of the junction. The first section 11 of the input plasma duct together with the output plasma duct 9 form the plasma-guiding channel having an exit opening or port 13, opposite to which the work piece or substrate 34, i.e., the object to be treated is placed. The first and the second sections 11 and 12 of the input plasma duct 8 incorporate first and second magnetic coils 14 and 15, respectively. The output plasma duct 9 also incorporates an output magnetic coil 16. Between the first input magnetic coil 14 and the second input magnetic coil 15 there is a means for magnetic field control, realized preferably as a first correcting magnetic coil 17 and a second correcting magnetic coil 18 that each embrace the input plasma duct in what we elect to call "saddle" fashion; these magnetic coils are arranged adjacent to each other.

The portions of the first correcting magnetic coil 17 and second correcting magnetic coil 18 disposed along the side of the output plasma duct 9 are bent back into opposing flares 17' and 18' generally disposed orthogonal to the output plasma duct 9. Flares 17' and 18' may be said to additionally provide the magnetic coils 17 and 18 with the saddle-like configuration in view of the resulting compound curvature shape of the magnetic coils, a shape perhaps best appreciated in the FIG. 2 drawing. The input-opposite end of the input plasma duct 8 is closed by a cover 19 in which there is received an electrode 20 that is electrically insulated from the plasma duct 8 and preferably connected to a source of bias supply voltage 37. The source 37 may be operated at a typical potential in the range of 5 to 40 volts. The exit end or port 13 of the output plasma duct is connected to the vacuum chamber 39 housing the work piece or substrate 34 being treated. The dimensions (lengths and diameters) of the anode 4 and the plasma ducts 8 and 9 are chosen so as to exclude the direct line-of-sight between the working surface 3' of the cathode 3 and the exit opening 13 of the plasma-guiding channel. The plasma ducts 8 and 9 are vacuum-tightly connected with the anode 4 and the vacuum chamber 39, respectively, through insulators that are not shown in the FIG. 1 drawing. The internal walls of plasma ducts 8 and 9 carry transverse plates or fins 21 intended to suppress the rebound of macroparticles from the plasma duct walls. The plasma filter 2 can be provided, if necessary, with an optional plasma duct lengthening section 9a and an attending supplemental magnetic coil 16a. The lengthening section 9a is useful when the output of the filter is to be delivered over unusually long distances to the vacuum chamber 39 and substrate 34 or within the vacuum chamber 39. An exit end or port for the lengthening section 9a is indicated at 13': this identification is similar to that of the exit end or port 13 of the output planar duct discussed above herein.

Figure 2:
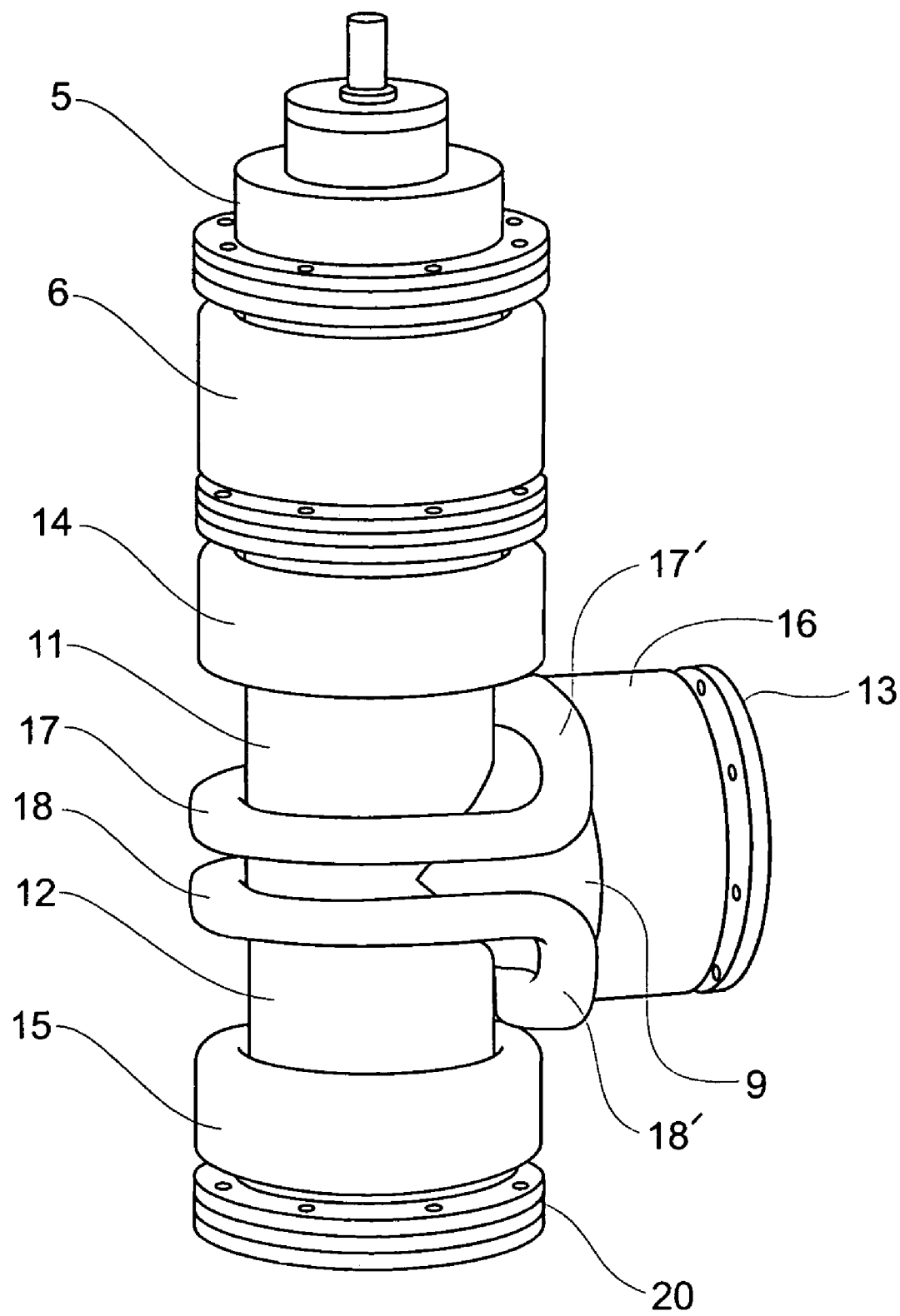
FIG. 2 shows a three-dimensional representation of the plasma source of FIG. 1.

The arrangement of the main components of the filtered cathodic-arc plasma source may be better understood by reference to its three-dimensional external view as is presented in the drawing of FIG. 2. In particular, the shape of the correcting magnetic coils 17 and 18 may be more easily understood from this FIG. 2 drawing. An additional view helpful with respect to the correcting magnetic coils 17 and 18 and adjacent central portions of the source appears in FIG. 7c herein. In the FIG. 2 and FIG. 7 drawings and the other drawings of the present document the same part is given the same identification number in each drawing to the best degree possible The optional lengthening section 9a is omitted in the FIG. 2 three-dimensional drawing.

The FIG. 1 described filtered cathodic-arc plasma source is operated as follows. At a given vacuum in the chamber (within the range from $10^{-4}$ to 10 Pascals or Newtons per square meter) and with the arc and magnetic coil power supplies 35 and 38 switched-ON, an arc discharge between the cathode 3 and the anode 4 is initiated with an igniter (not shown in the drawings). On the cathode working surface 3' there arises a chaotically moving cathode spot confined on the surface by the magnetic field of magnetic coil 5. The cathode spot emits a plasma flow that propagates towards the cavity of the anode 4. Here, in the presence of the magnetic field generated by magnetic coil 6, the plasma is focused and directed to the plasma ducts 8 and 9. Since cathode arc currents typically in the range of 50 to 200 Amperes are contemplated and voltages in the range of 25 to 50 volts are present, considerable heat energy is dissipated at the cathode surface 3' and at the anode 4. In practice this heat energy is preferably dissipated by for example a watercooling apparatus. Such apparatus is known in the art and is therefore omitted from FIG. 1 and the other drawings herein in the interest of drawing simplicity and clarity.

Operation-Theory

Plasma transport from the cathode 3 to the exit port 13 in the FIG. 1 apparatus is provided in the following way. The magnetic coils attending the anode and the plasma ducts generate a magnetic field in the plasma-guiding ducts. The intensity of this field is chosen so that the condition $\rho_e \ll \alpha \lesssim \rho_i$ is fulfilled where $\rho_e$ and $\rho_i$ are the Larmour radii of electrons and ions respectively and $\alpha$ is the radius of the plasma duct. The nature of the Larmour radius and the attending spiral motion of charged particles including electrons and ions in a magnetic field is known in the art and is described for example in the Russian handbook text "Fizicheskiy Entsiklopedicheskiy Slovar", M., "Sovietskaya Entsiklopediya", 1984, pages 352-536 and in the English handbook text of D. Rose and M. Clark "Plasmas and Controlled Fusion" published jointly by the Massachusetts Institute of Technology Press and John Wiley & Sons, Incorporated, New York-London. In this Larmour motion a particle moves along a magnetic line of force with a lateral component of velocity $V_{II}$ rotating simultaneously around the magnetic line with a Larmour frequency. For electrons and ions, respectively, these frequencies are:

$$w_e = \frac{eB}{m_e} \text{ and } w_i = \frac{ZeB}{m_i}$$

The radii of the circular turns of the spiral, the Larmour radii, for electrons and ions are, respectively, $$\rho_e = \frac{eV_{e\perp}}{m_e B} \text{ and } \rho_i = \frac{ZeV_{i\perp}}{m_i B}.$$

Here e is the electron charge, Z is the charge multiplicity of the ion, $m_e$ and $m_i$ are the electron mass and ion mass, $V_{e\perp}$ and $V_{i\perp}$ are the transversal velocities of electron and ion and B is the magnetic field strength, i.e., the magnetic field strength established by the magnetic coils in the present invention.

In the present invention instance it may be generally stated that the electrons are magnetized, and the ions are not. Speaking more precisely, however, the magnetic field in the filter 2 responds to the relation $$\rho_e \ll a < \rho_i,$$

$$\text{or } a \gg \frac{eV_{e\perp}}{m_e B} \quad (1)$$

$$a < \frac{ZeV_{i\perp}}{m_i B} \quad (2)$$

In relation equation 1 here the motion of electrons is completely controlled by the magnetic field present; in such instances it is said that electrons are magnetized. Contrariwise, according to relation 2 and the magnetic field strength present in our filter the magnetic field present does not influence the ion motion i.e., the ions are not magnetized. This relationship is possible for relatively low intensive magnetic fields and for systems of restrained size in view of the very large mass of an ion as compared to the mass of an electron; e.g. for $T_i^+$ cathode material: $m_i \approx 88000 m_e$.

In the present invention, for the most practical cases the plasma duct radius, $\alpha$, ranges between 10 millimeters and 100 millimeters. The magnetic field, B, fulfilling the relations (1) and (2) in such instances is in the approximate range of 5 to 50 milliTeslas. If B is made so low that the relation (1) is not fulfilled, then the transport quality of the filter drops due to increased losses of electrons at the duct walls. If the magnetic field strength is made so high that the relation (2) is not fulfilled it is almost impossible inject plasma into the filter because of a strong magnetic mirror that appears at the entrance of the plasma guiding channel.

In the thusly-magnetized plasma, electrons are moving in a spiral of radius $\rho_e$ along the magnetic field lines and cannot move across the field as the plasma conductivity is high along the field and is very low in the direction across the field. Therefore, the magnetic field lines in the system are essentially equipotential in character. They acquire the potential of those electrodes, which they intersect. Thus, the magnetic flux tube intersecting the working end of the cathode has the potential of this electrode (to an accuracy of the cathode drop).

The electrons produced on the cathode are moving along this flux tube, and the ions confined by the electrostatic field of electrons follow them. The condition of plasma quasi-neutrality is thus retained. Since the plasma ducts are insulated from the anode and the chamber, which are, as a rule, grounded, the plasma duct walls are charged positively by the portion of high-energy ions that cannot be confined by the space charge of electrons driven by the magnetic flux tube. In this case, the plasma duct walls are at positive floating potential. The radial electric field occurring between the transporting magnetic flux tube and the positively charged walls of the plasma duct favors the transport of the plasma ion component. As experience shows, in order to improve the efficiency of plasma transport with respect to the plasma duct walls, a forced positive bias potential should be supplied to the duct walls from a special voltage source. Such a source appears at 36 in the FIG. 1 drawing and is typically operated at a voltage potential of 5 to 15 Volts. With such bias potential, owing to ion deceleration by the radial electric field, the plasma losses on the plasma duct walls are reduced.

Aside from diffusion across the magnetic field, the transverse displacement of plasma due to the so-called centrifugal and gradient drifts is also responsible for plasma losses in apparatus of the present invention type. In a inhomogeneous curvilinear magnetic field, as a consequence of the presence of the transverse velocity component, the plasma particles drift perpendicularly to grad H, i.e., in a normal to the plane of magnetic field line bending along which the particles were initially moving. This drift initiates plasma polarization, because the particles of different sign drift in opposite directions. Under the action of crossed electric field of polarization and magnetic field, the plasma as a whole is displaced towards the convexity of the bent magnetic field line. This is the so-called gradient drift of plasma. In traditional systems, where the magnetic lines are bent to one side, this plasma drift brings the plasma flow in contact with the plasma duct wall (for flow external with respect to the center of curvature, i.e., on the side of magnetic line convexity). In this contact, a part of the plasma flow is lost on the wall.

Figure 4:
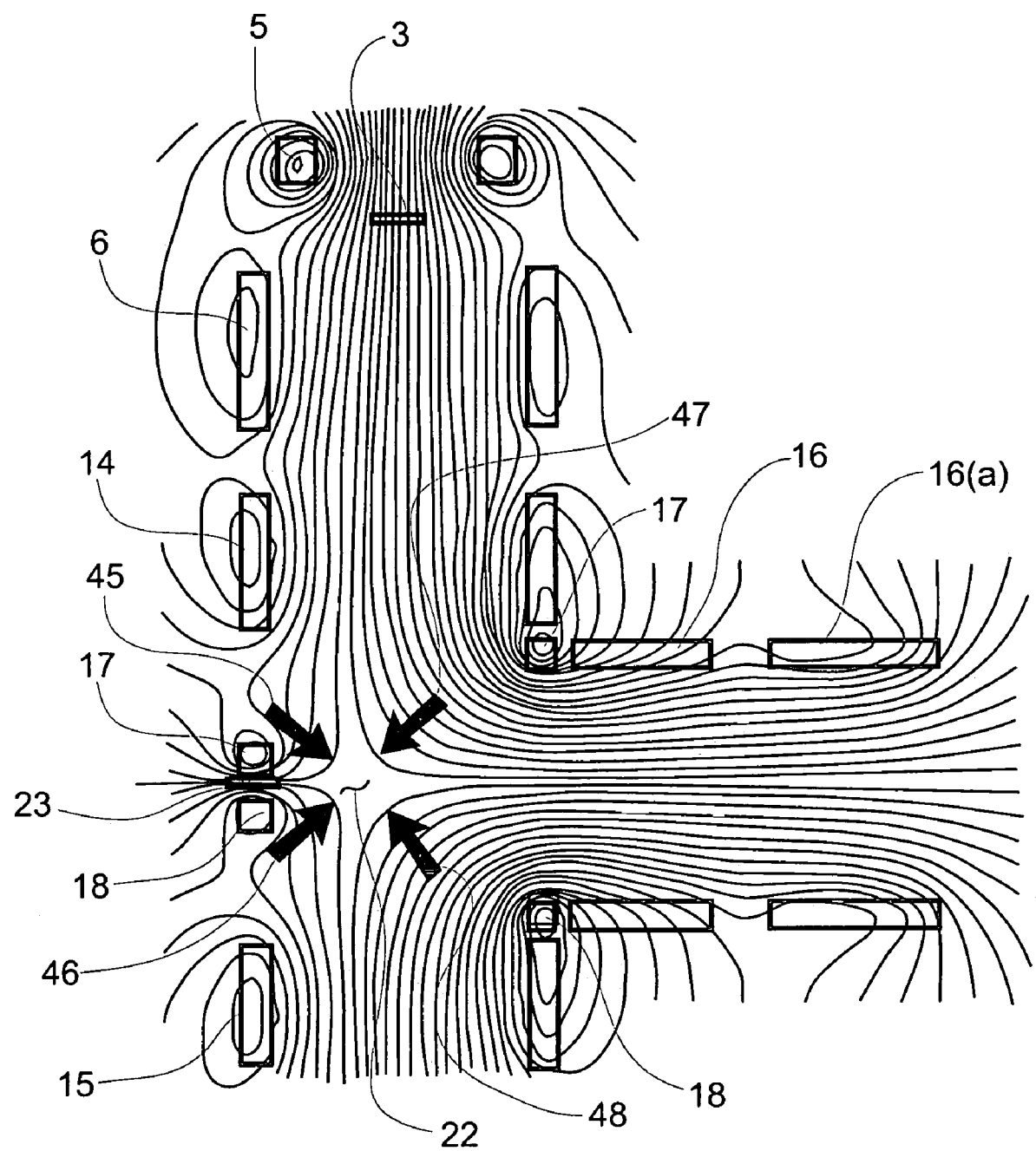
FIG. 4 shows the distribution of magnetic field lines in the plasma-guiding channel of the FIG. 1 plasma source.

Unlike the known systems, in the present invention the magnetic lines in the region of plasma flow turn, i.e., between the first and second input magnetic coils 14 and 15, the magnetic lines diverge in a fan-like manner in all directions, so that the centers of their curvature are distributed around the circles embracing the input plasma duct 8 on both sides of the magnetic slit 23 in FIG. 4. As a result, the gradient plasma drift directed towards the magnetic line convexity causes all parts of the plasma flow to drift inward from the plasma duct rather than toward its walls in the present invention. In this way the plasma losses due to the gradient drift are excluded in the invention. The gradient drift of plasma considered here is, as mentioned above, the result of the presence of the transverse component of the velocity of charged plasma particles (ions and electrons). The longitudinal component of the velocity of the motion in the curvilinear magnetic field leads to the charge separation and to plasma polarization in the plane of magnetic line bending in the present invention. That is, the magnetized electrons move in a spiral along the magnetic field lines and the heavy, not magnetized ions, moving in substantially straight-line trajectories, are shifted under the action of centrifugal force G towards the magnetic line convexity.

In the present invention the electric field of polarization is directed to the center of curvature of the magnetic field line (opposite to the vector of the radius of curvature R) and this causes the plasma as a whole to drift towards [H×G] or [H×R]. This is the so-called centrifugal drift. In known curvilinear filters, where the magnetic fields are bent in one direction (e.g., as a part of a torus), owing to this drift, the plasma is displaced to one of the lateral walls of the plasma duct (depending on the direction of H). Being in contact with the wall, a part of the plasma flow is lost in such filters. However, in the present invention the displacement of plasma as a whole occurs not in the straight line as in the known devices, but in an arc around the near-axis zone of the plasma duct, without touching the walls of the duct. In this way, plasma losses due to centrifugal drift of plasma are minimized in the present invention.

Figure 3:
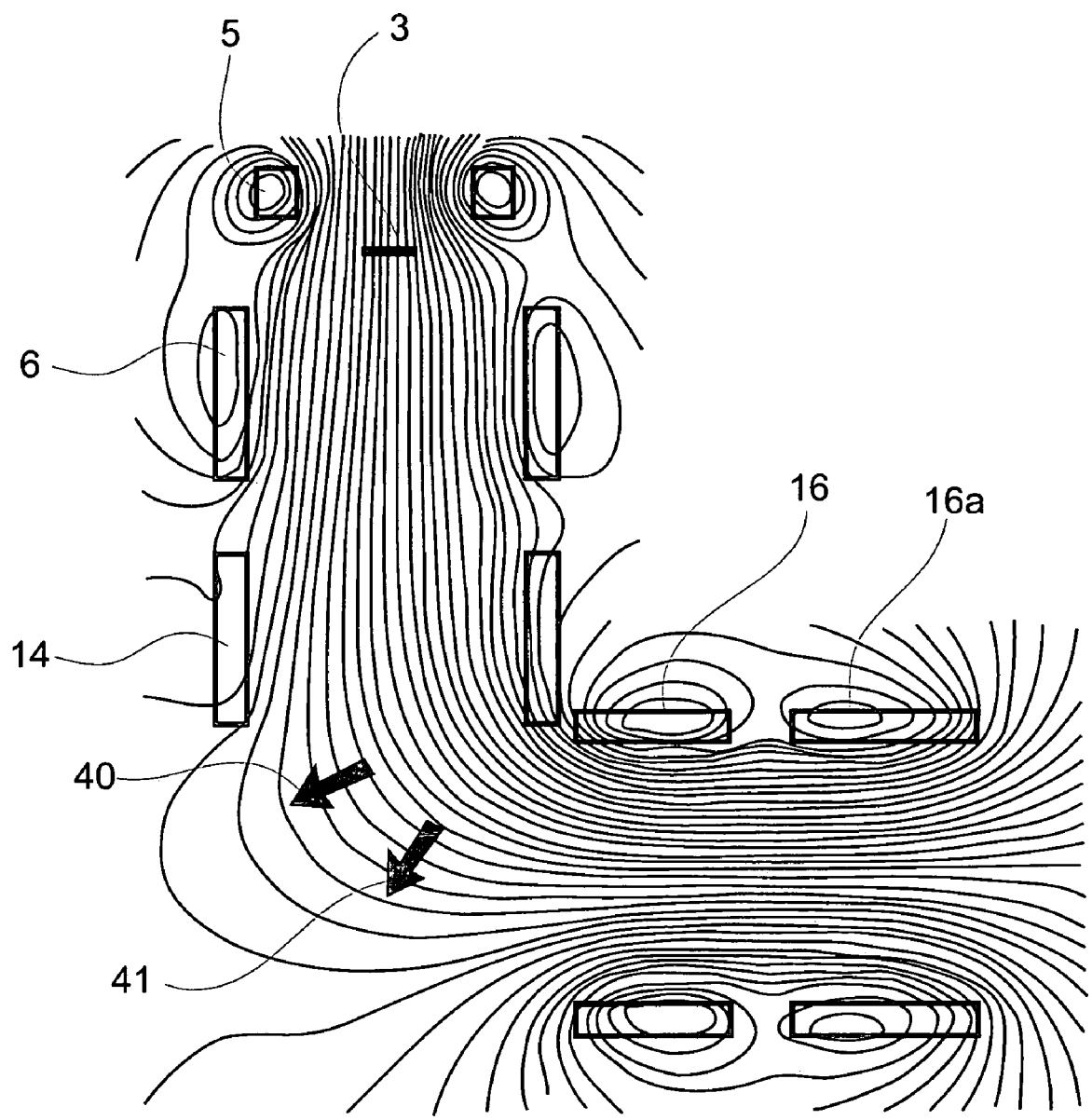
FIG. 3 shows the distribution of magnetic field lines used in the plasma-guiding channel of a prior art plasma source with an L-shaped plasma duct filter.

FIG. 3 in the drawings shows the course of magnetic field lines in magnetic coils 14 and 16 when connected as in a known prior art L-shaped filter having two magnetic coils arranged at a right angle to each other. The arrows 40 and 41 in FIG. 3 show the direction of the gradient drift of plasma discussed above, i.e., its shift occurs to the outer wall (with respect to the center of curvature of the magnetic lines) of the plasma-guiding channel. The centrifugal drift is here directed perpendicularly to the plane of the drawing, i.e., onto one of the lateral walls of the plasma duct, depending on the magnetic field direction.

FIG. 4. in the drawings shows the magnetic field distribution in the present invention plasma source. Unlike the situation shown in FIG. 3, between the magnetic coils 14, 15 and 16 in FIG. 4 there exists a zone 22 having zero magnetic field and forming a magnetic slit 23. In the zone 22 there is increasing field strength with distance from the zone center. The arrows 45, 46, 47 and 48 in FIG. 4 show the direction of the gradient drift. Here, the centrifugal drift manifests itself as a plasma flow displacement in an arc, (not shown in the drawing) around zone 22 in the plane normal to the plane of the drawing. Thus, the gradient and centrifugal drifts contacts of the plasma flow with the plasma duct walls do not occur in the FIG. 4 situation and the resulting plasma loss is avoided.

The macroparticles generated by the cathodic arc during operation of the FIG. 1 apparatus are removed from the plasma flow of the present invention in the following way. First it should be noted that the second section 12 of the plasma duct 8 captures a major part of the macroparticles, which flow along the input plasma duct 8. Section 12 along with the cover 19 and the electrode 20 thus serve as a collector-trap of the material leaving the cathode 3 in the form of macroparticles and neutral vapors. At the same time, parts of the macroparticles also come to the output plasma duct 9. However, since between the cathode 3 and the exit port 13 there is no direct line-of-sight path, the macroparticles flowing off the cathode in direct trajectories cannot arrive at the exit of the system without collisions with the duct walls.

In the event of such collisions, a macroparticle either sticks to the wall, or recoils from the wall if the particle is solid. At maximum initial velocities, the macroparticle must undergo several partially elastic collisions with the walls before its translational motion ceases. To prevent the possibility of macroparticle arrival at the exit port of the system due to multiple rebounds from the plasma duct walls, the wall surfaces are provided with a set of transverse barriers in the form of the fins or plates 21 shown in the FIG. 1 drawing. These fins or plates are considered to be present but not shown in the other drawings herein for reasons of drawing clarity and convenience.

Figure 5:
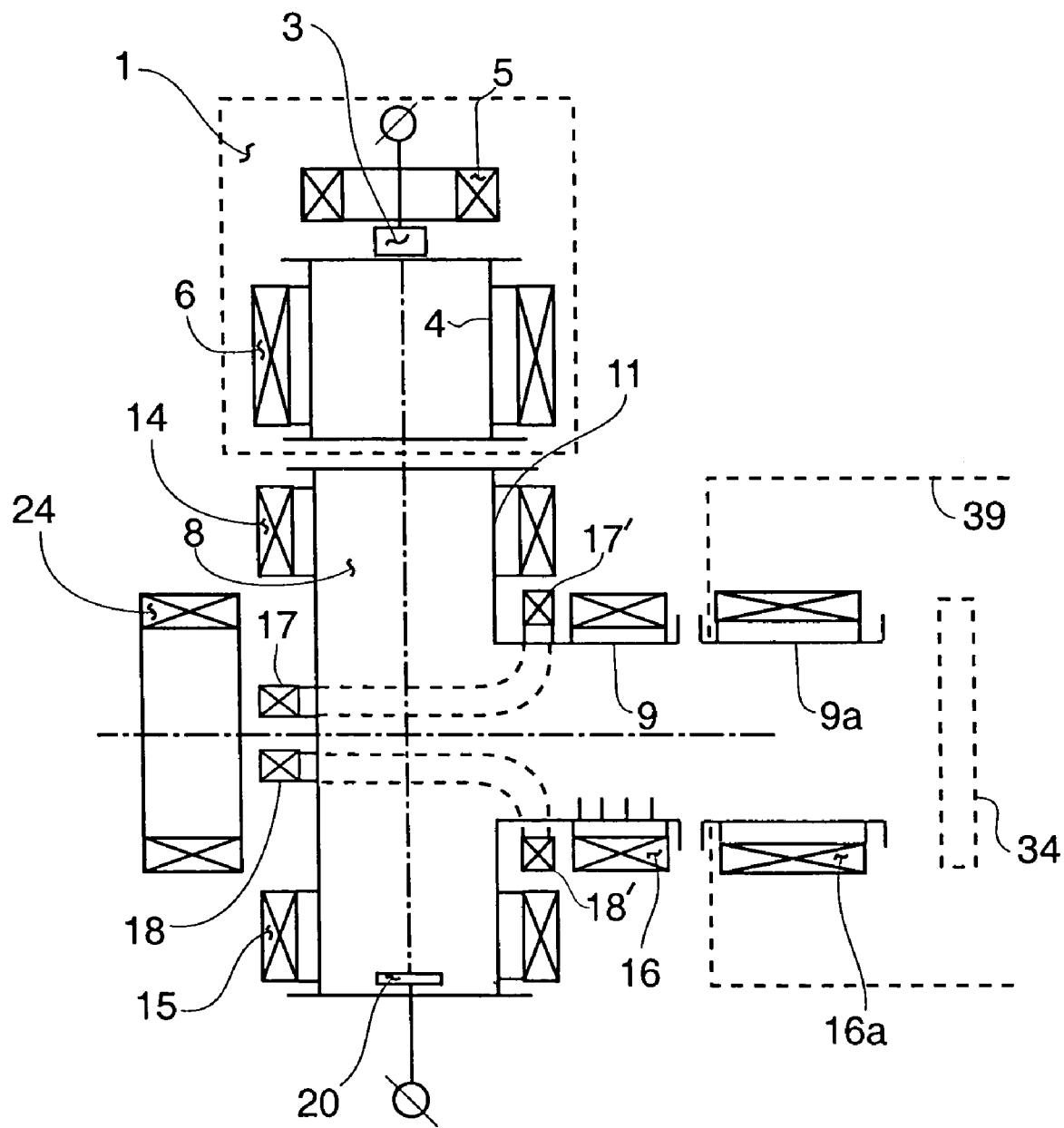
FIG. 5 shows the disposition of an output duct entrance magnetic coil 24 in the FIG. 1 plasma source.
Figure 6A:
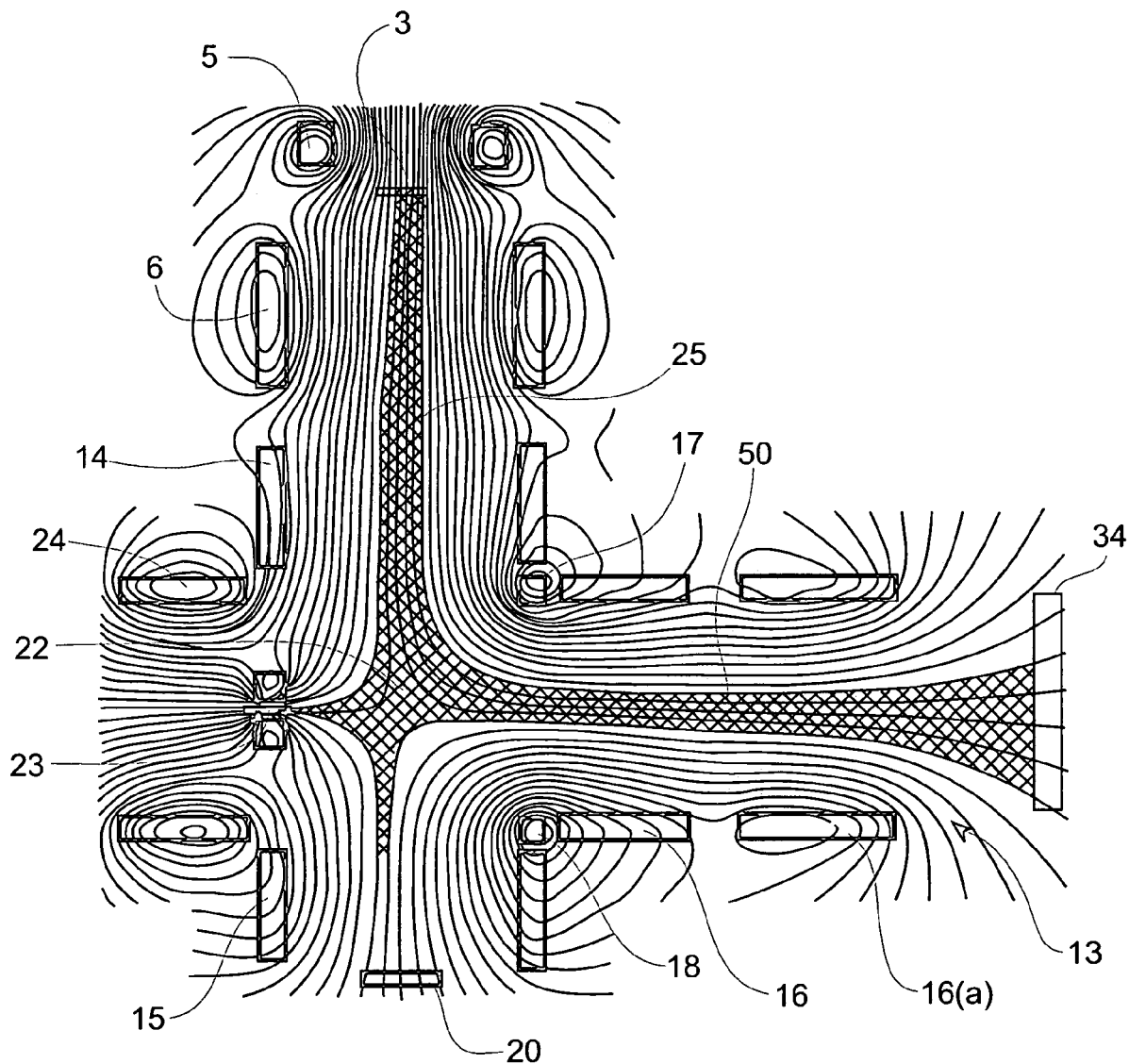
FIG. 6a shows the distribution of magnetic field lines in the plasma-guiding channel of the FIG. 1 plasma source using the FIG. 5 output duct entrance magnetic coil 24, two input magnetic coils 14 and 15 and two correcting magnetic coils 17 and 18 all connected in a first arrangement.
Figure 6B:
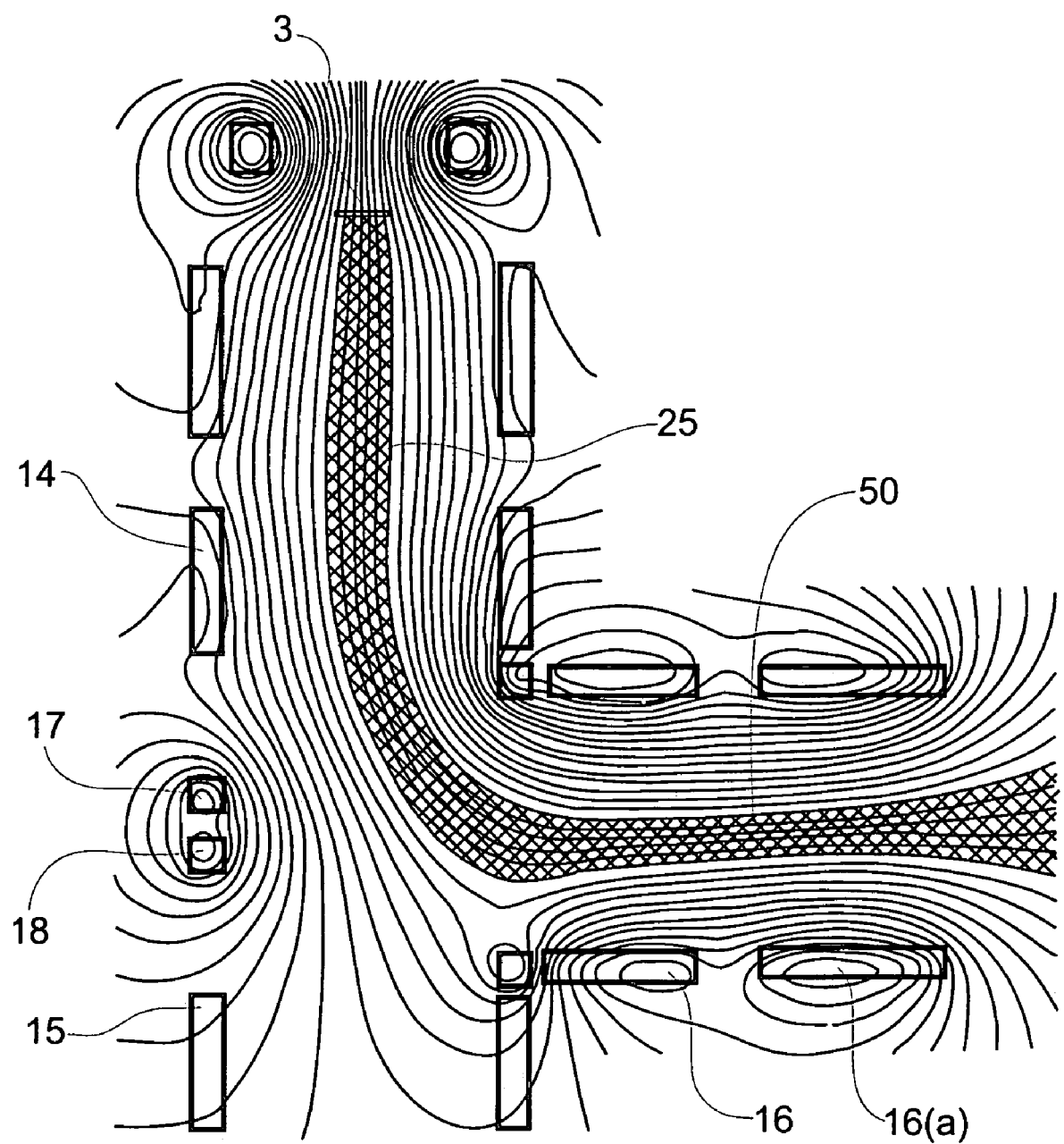
FIG. 6b shows the distribution of magnetic field lines in the plasma-guiding channel of the FIG. 1 plasma source using the two input magnetic coils 14 and 15 and two correcting magnetic coils 17 and 18 all connected in an aiding second arrangement.

FIG. 5 in the drawings schematically shows an arrangement of the present invention filtered cathodic-arc plasma source having an output duct entrance magnetic coil 24 that is disposed near the input plasma duct 8 opposite the output plasma duct 9 and coaxially with the output plasma duct. The output duct entrance magnetic coil 24 is preferably made to have an averaged diameter dimensioned between the diameter of the input duct 8 and the length of the input duct 8. The output duct entrance magnetic coil 24 is energized so that its magnetic field, as shown in FIG. 6*a*, is directed opposite to the magnetic field in the output magnetic coil 16 and is coincident with the field in the magnetic slit 23. As may be observed in FIG. 6*a*, the field in the magnetic slit 23 increases with use of the output duct entrance magnetic coil 24 (as compared to the field version represented in FIG. 4), and the field distribution inside the plasma duct becomes more symmetric, i.e., the zone 22 with minimum magnetic field is displaced to the center of the system. In this case, nearly all the plasma flow 25 generated by the working surface 3' of the cathode 3 comes to zone 22. This zone, as mentioned above, is characterized by a zero magnetic intensity at the center and increasing field strength with distance from the center. The cross hatching in the zone 22 and other locations of FIG. 6*a* and in FIG. 6*b*, FIG. 6*f* and FIG. 6*g* represent magnetic flux tubes and generally indicate the location of plasma flow in the plasma filter 2.

The field configuration in zone 22 is known as an acute-angled or cusped magnetic-electric trap. The electrons received from the source 1 can escape from this trap through axial cusps along the plasma ducts 11, 12 and 9 and through the annular cusp (magnetic slit) 23. The field strength of the magnetic coils contributing to the zone 22 are chosen such that in the axial cusps along the plasma ducts 11 and 12, and also in the slit 23, the fields form magnetic mirrors that prevent electron pass through. Only an insignificant part of electrons moving immediately along the central lines of the cusps in the plasma ducts 11, 12 and in the slit 23 may thus leave the trap. The only channel where the electrons may go unimpeded along the magnetic field lines is the part of the magnetic slit with a weaker field, which changes to the channel 50 in the output plasma duct 9. The space charge of electrons in the trap 22 forms a potential well for ions. Having undergone a few rebounds from the walls of the potential well and having lost a part of their kinetic energy, the ions come to the channel of the output plasma duct 9 and, together with electrons, travel in the form of a quasi-neutral plasma flow to the exit port 13 of the system. A reduction in the kinetic ion energy in the plasma generated by the present invention appears to be an advantage of importance in the deposition of coatings onto a substrate sensitive to the action of high-energy particle flows, e.g., in the deposition of a protective coating on the magnetic layer of hard memory disks.

In order to better describe the cooperation occurring between the magnetic coils 17, 18 and 24 in achieving the desired magnetic flux and channel 50 configuration shown in the drawing of FIG. 6a, using the FIG. 1 arrangement of the invention, the additional drawings of FIG. 6c through FIG. 6g are included in the present document. These FIG. 6c through FIG. 6g drawings show the results of operating several of the concerned magnetic coils. These drawings therefore are believed helpful in appreciating the contribution of for example the correcting magnetic coils 17 and 18 to achievement of the desired flux pattern in the plasma ducts. Identification of the particular abnormal operation represented in each of the FIG. 6c through FIG. 6g drawings is accomplished in the "Brief Description of the Drawings" topic above. The + sign appearing at the coils in the FIGS. 6c through 6g indicate the relative directions of the electrical currents in the coils ignoring the winding turns direction. E.g., the two + signs 55 and 57 appearing at the opposite sides of the coils 17 and 18 in the FIG. 6c drawing indicate the opposed directions of the electrical currents in this coils and hence relative (opposed to each other) polarities of magnetic flux generated by the coils 17 and 18 in contributing to the overall flux pattern appearing in FIG. 6a of the drawing.

The terminology "electrical current generating a same magnetic polarity" and "electrical current providing an opposed magnetic polarity" and closely related language also appears in the present document and may be understood to describe current flowing in flux generating windings of a magnetic coil ignoring the usual concern for winding turns direction and electrical polarity applied. Magnetic flux providing a given force direction on a unit "North" magnetic pole may for example result from application of a positive electrical polarity to a winding start terminal of a clockwise wound magnetic coil or from application of a negative electrical polarity to a winding start terminal of a counter-clockwise wound magnetic coil, hence each of these connections achieves an "electrical current generating a same magnetic polarity".

Figure 6C:
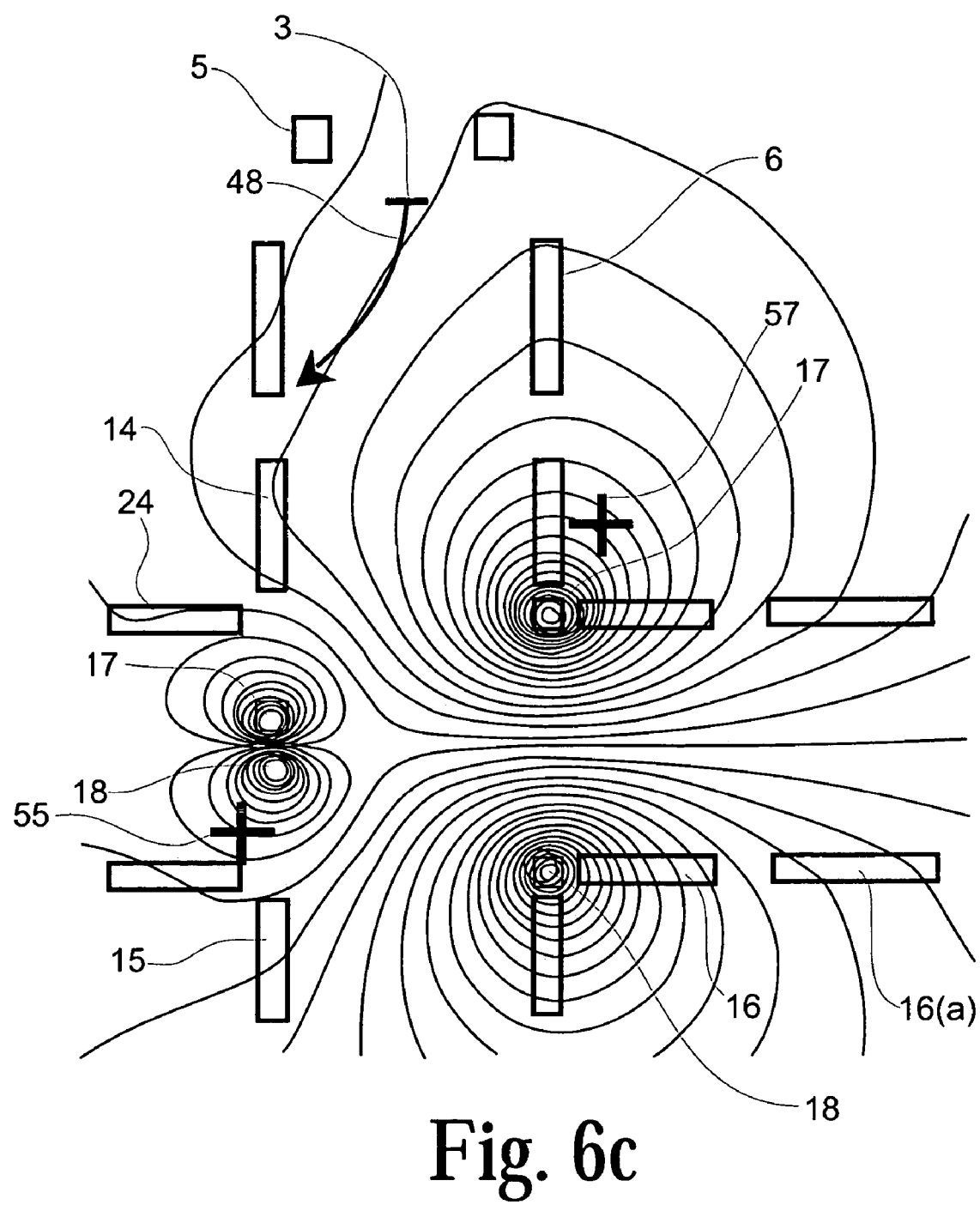
FIG. 6c shows the distribution of magnetic field lines in the plasma-guiding channel of the FIG. 1 plasma source when only the two correcting magnetic coils 17 and 18 are energized.
Figure 6D:
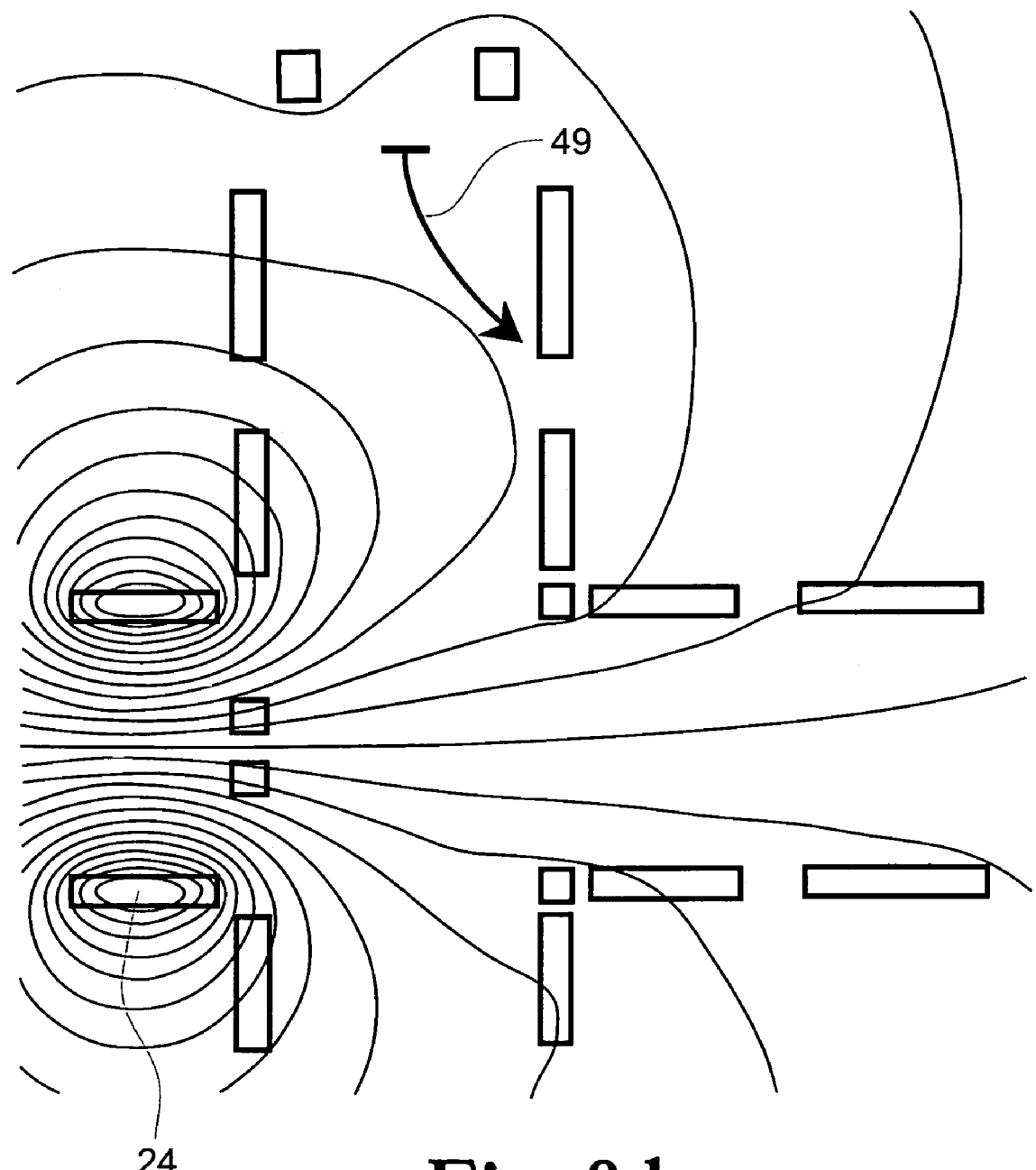
FIG. 6d shows the distribution of magnetic field lines in the plasma-guiding channel of the FIG. 1 plasma source when only output duct entrance magnetic coil 24 is energized.
Figure 6E:
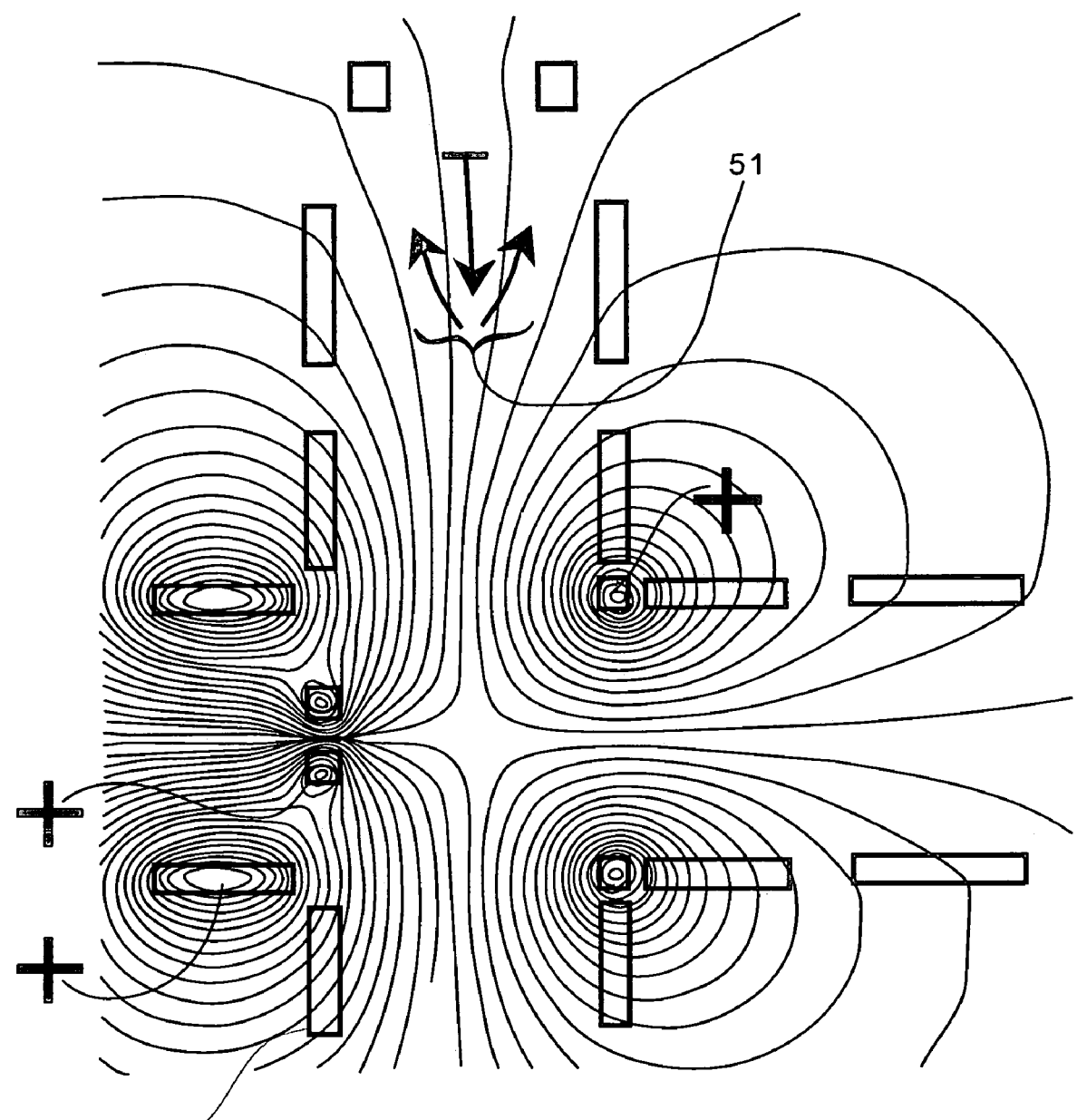
FIG. 6e shows the distribution of magnetic field lines in the plasma-guiding channel of the FIG. 1 plasma source when output duct entrance magnetic coil 24 and two correcting magnetic coils 17 and 18 are energized.
Figure 6F:
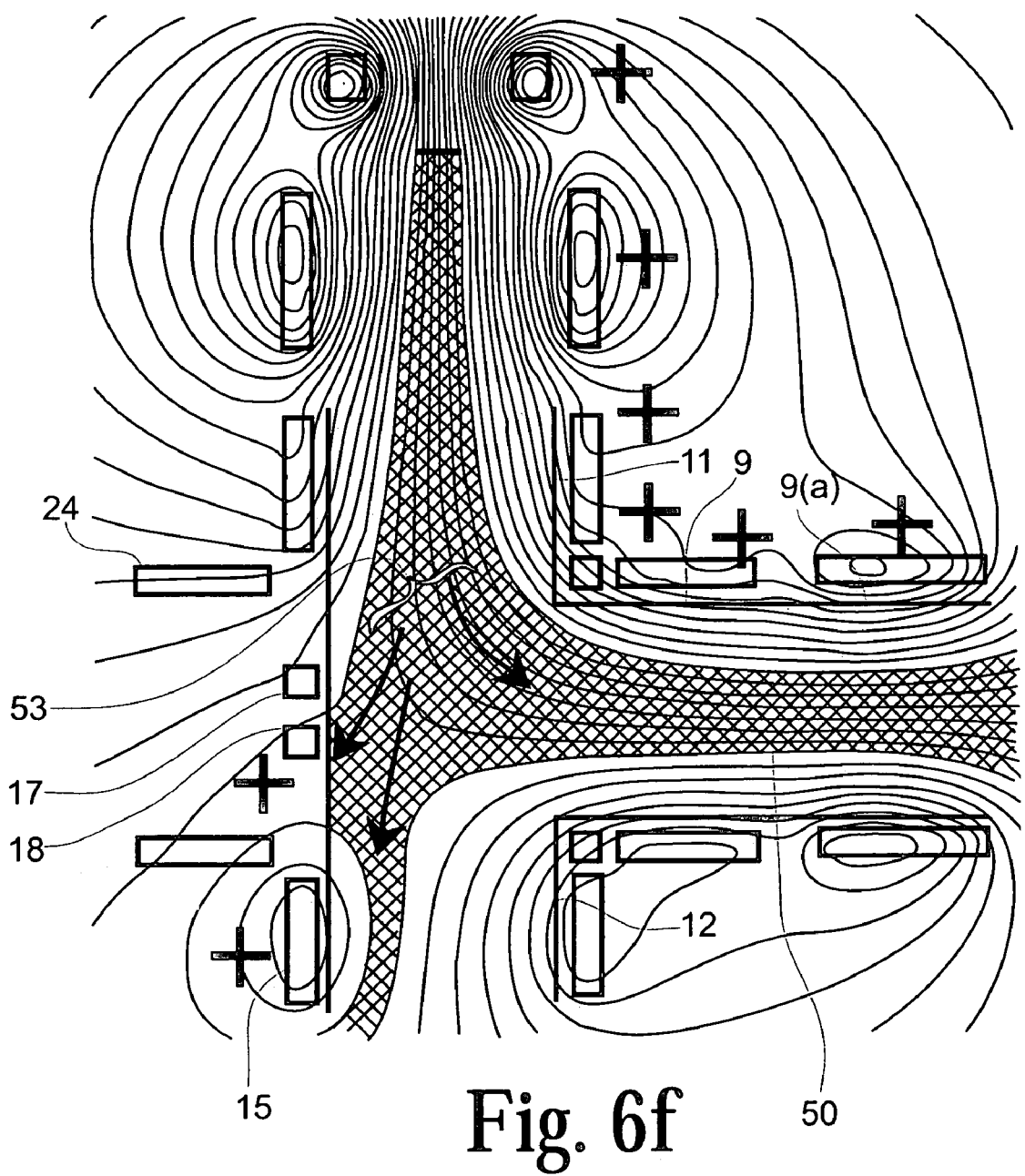
FIG. 6f shows the distribution of magnetic field lines in the plasma-guiding channel of the FIG. 1 plasma source when all of the FIG. 1 magnetic coils excepting coils 17, 18 and 24 are energized.
Figure 6G:
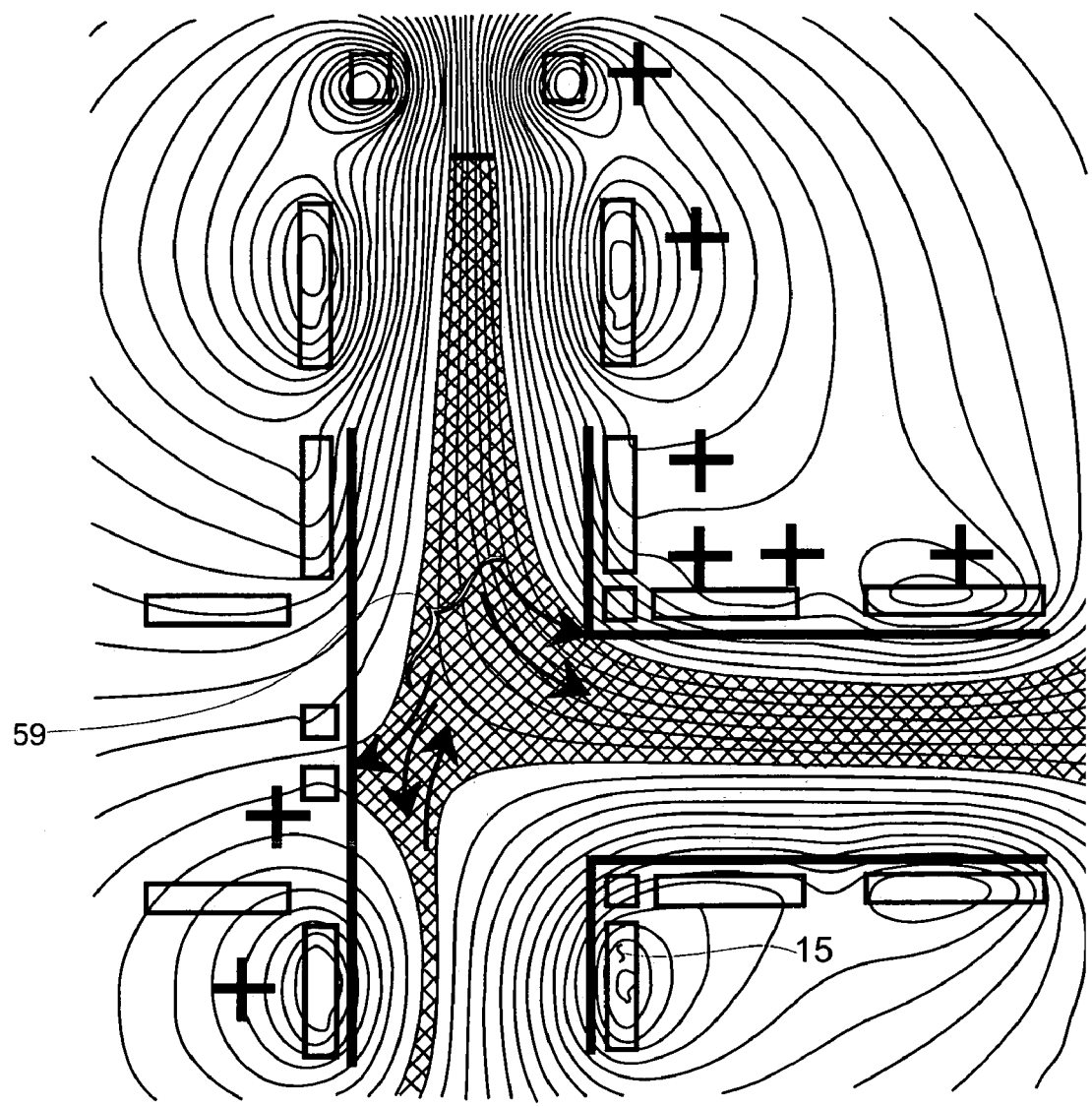
FIG. 6g shows the distribution of magnetic field lines in the plasma-guiding channel of the FIG. 1 plasma source when all of the FIG. 1 magnetic coils excepting coils 17, 18 and 24 are energized and magnetic coil 15 is energized with twice the current of the FIG. 6f energization.

The arrow 48 appearing in FIG. 6c shows the path of plasma departing from the cathode surface 3' when influenced solely by the field of the magnetic coils 17 and 18. The arrow 49 in FIG. 6d shows the path of plasma departing from the cathode working surface 3' when influenced solely by the field of the output duct entrance magnetic coil 24. Operating the magnetic coils 17, 18 and 24 simultaneously forms the magnetic field of the FIG. 6e configuration. The arrows 51 in the FIG. 6e show the path of plasma departing from the cathode working surface 3' and its subsequent reflection from converging magnetic lines that act as a "magnetic mirror".

The path of plasma departing from the cathode working surface 3' in the magnetic field generated when the coils 5, 6, 14, 15, 16 and 16(a) operate simultaneously (with the coils 17, 18 and 24 switched off) is shown in the FIG. 6f drawing. The three arrows 53 in FIG. 6f show the path of the plasma includes the "useful" direction into the channel 50, and also the undesirable directions of onto the lateral wall of the input duct and through the magnetic cusp toward the wall of the second section of the input duct (the macroparticle trap). At the considered operation of the coils the area of contact of the plasma with the wall of the input duct and the cross section of the magnetic field cusp in the second section of the input duct and hence corresponding plasma losses decrease with an abnormal (e.g. twofold) increase of a current in the coil 15. However in this case the additional flow of losses appears near the upper edge of the entrance opening of the output duct (see arrows 59 in the FIG. 6g). Thus it follows from these considerations that the desired magnetic field configuration is that appearing in FIG. 4 and FIG. 6a and hence the best result in plasma flow transportation is achieved in accordance with the invention, i.e. when using all the coils of the FIG. 1 or FIG. 5 arrangements.

The electrode 20, shown in FIGS. 1 and 5, is arranged at the end or cover 19 of the plasma duct section 12, and overlaps the central part of the cover. Electrons escaping through the cusp along the duct section 12 come to the electrode 20 and tend to charge it negatively. Preferably however such a negative potential is maintained by the bias supply source 37 as is explained above herein. This charging suppresses electron escape from the input plasma duct 8 and is favorable for the retention of a desirable increase in the negative space charge of electrons inside the plasma ducts. In turn, this is beneficial for ion density increase in the plasma-guiding channel, and hence, for the more efficient transport of ions to the exit 13 or 13' of the system.

Figure 7A:
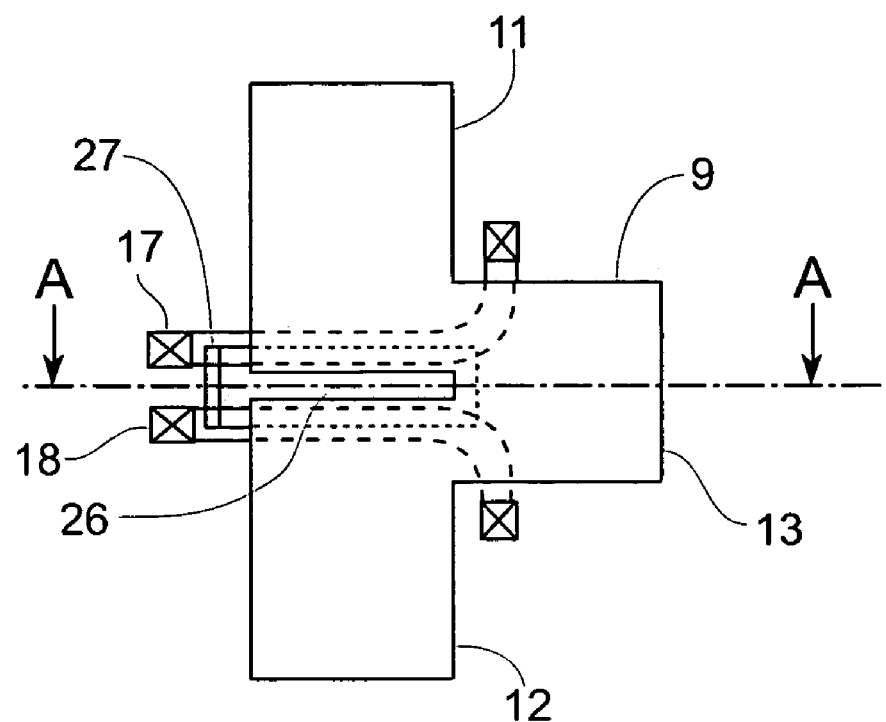
FIG. 7a shows an input plasma duct slit and a screen portion of the FIG. 1 apparatus in an elevation view.
Figure 7B:
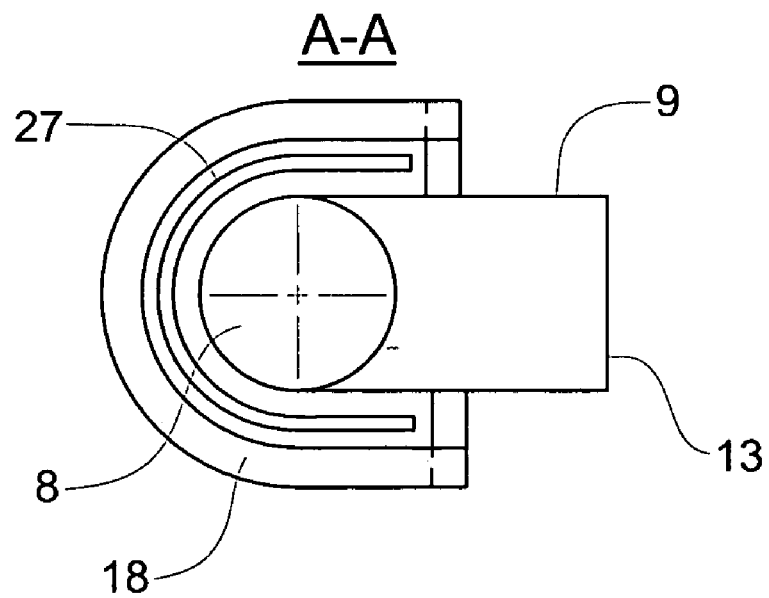
FIG. 7b shows the FIG. 7a screen in a plan view.
Figure 7C:
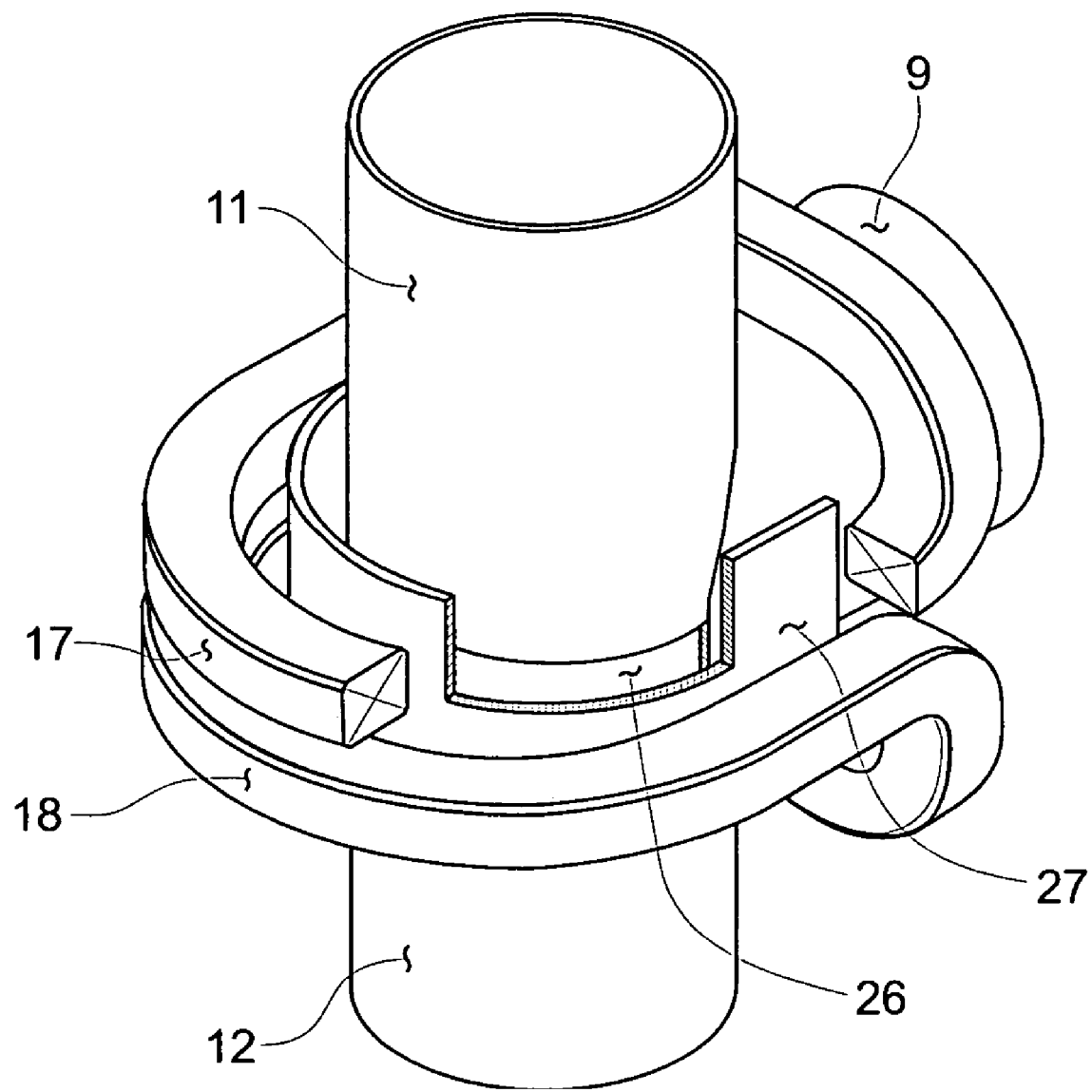
FIG. 7c shows the FIG. 7a plasma duct slit and screen in a three-dimensional cut away view.

In order to prevent plasma losses, caused by leakage of some portion of the electrons from the zone 22 through the magnetic slit 23 onto the wall of the plasma duct 8, and thus to further improve the efficiency of plasma passage through the plasma-guiding channel of the invention, it is advisable to provide a slit 26, as appears in the drawings of FIG. 7a and in FIG. 7c, in the wall of the input plasma duct 8, between its sections 11 and 12 in front of the opening 10. The slit 26 is closed from the outside by the screen 27, a screen electrically insulated from the duct 8. The position of this slit 26 in the plasma duct 8 is made coincident with the FIG. 6a position of the magnetic slit 23. Electrons moving from the zone 22 through the slit 26 toward the screen 27 impart a negative floating potential to the screen. This potential serves as a barrier to inhibit a further escape of electrons from the plasma-guiding channel inside the plasma ducts 8 and 9 and contributes to the retention and even some increase of the negative space charge of electrons inside the plasma duct channel. In its turn, the charge retained by the screen 27 also aids in increasing the ion density in the duct and makes ion passage to the exit 13 of the system more efficient.

Additional Arrangements

Figure 8:
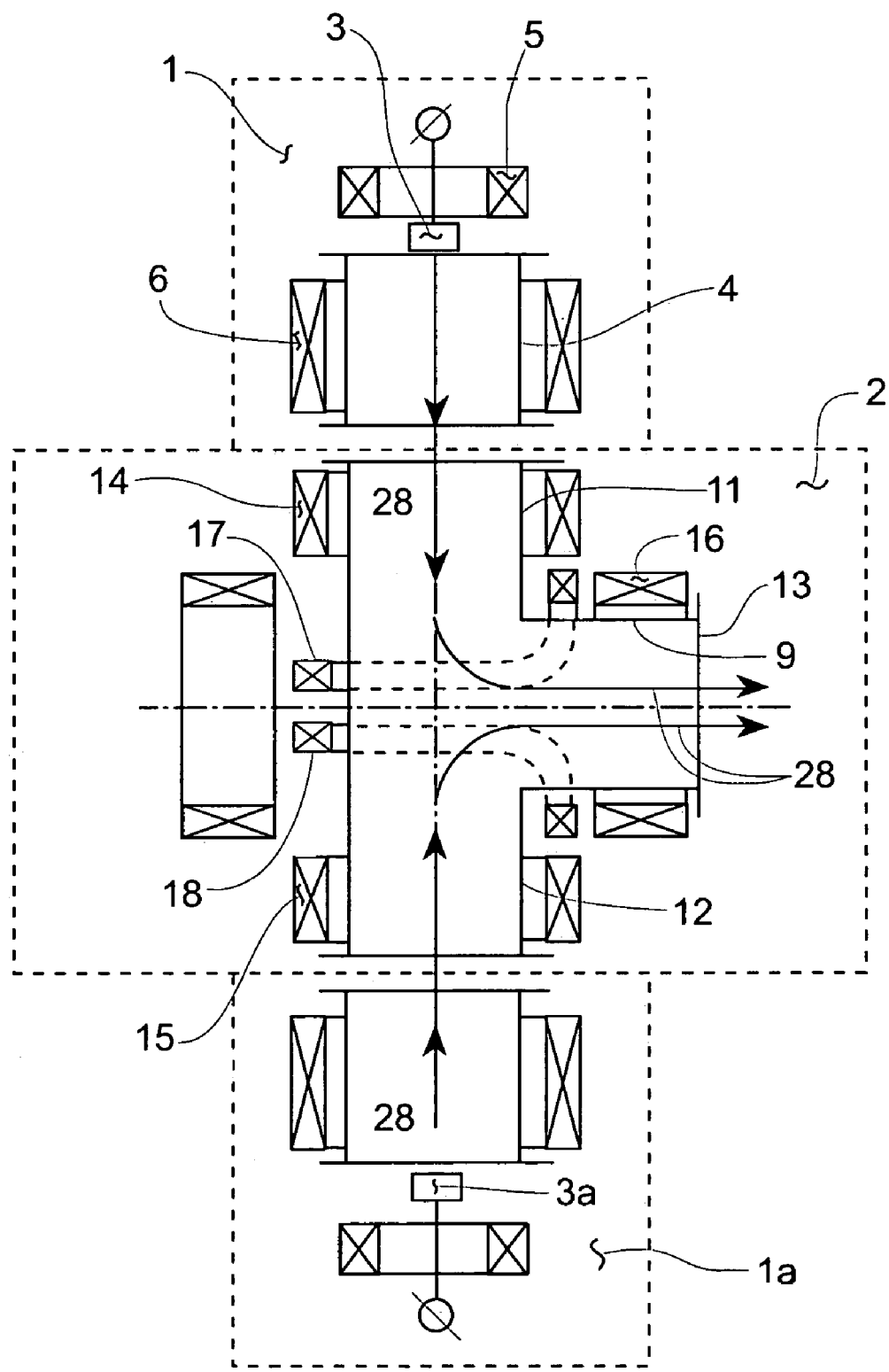
FIG. 8 shows the FIG. 1 plasma source with two plasma generators.

FIG. 8 in the drawings schematically shows an arrangement of the filtered cathodic-arc plasma source having two plasma generators 1 and 1a connected to opposite ends of the input plasma duct 8 of the plasma filter 2. Depending on the task to be accomplished, the cathodes 3 and 3a in the generators 1 and 1a are made of the same material or of different materials. In the same material case, under simultaneous operation of the both generators, a same-material plasma flow of nearly a double intensity is formed at the exit 13 of the FIG. 8 source. In the different materials case, the source emits a plasma flow, the composition of which includes materials from the two cathodes. The relative concentrations of these materials are determined by the relative magnitudes of the arc currents in the generators 1 and 1a. Owing to mixing of the plasma flows occurring in the zone 22 of magnetic field minimum, the distribution of each component in the plasma flow at exit 13 or 13' of the system tends to be uniform. The directions of plasma motion are shown by the multiple arrows 28 in the FIG. 8 drawing.

Figure 9A:
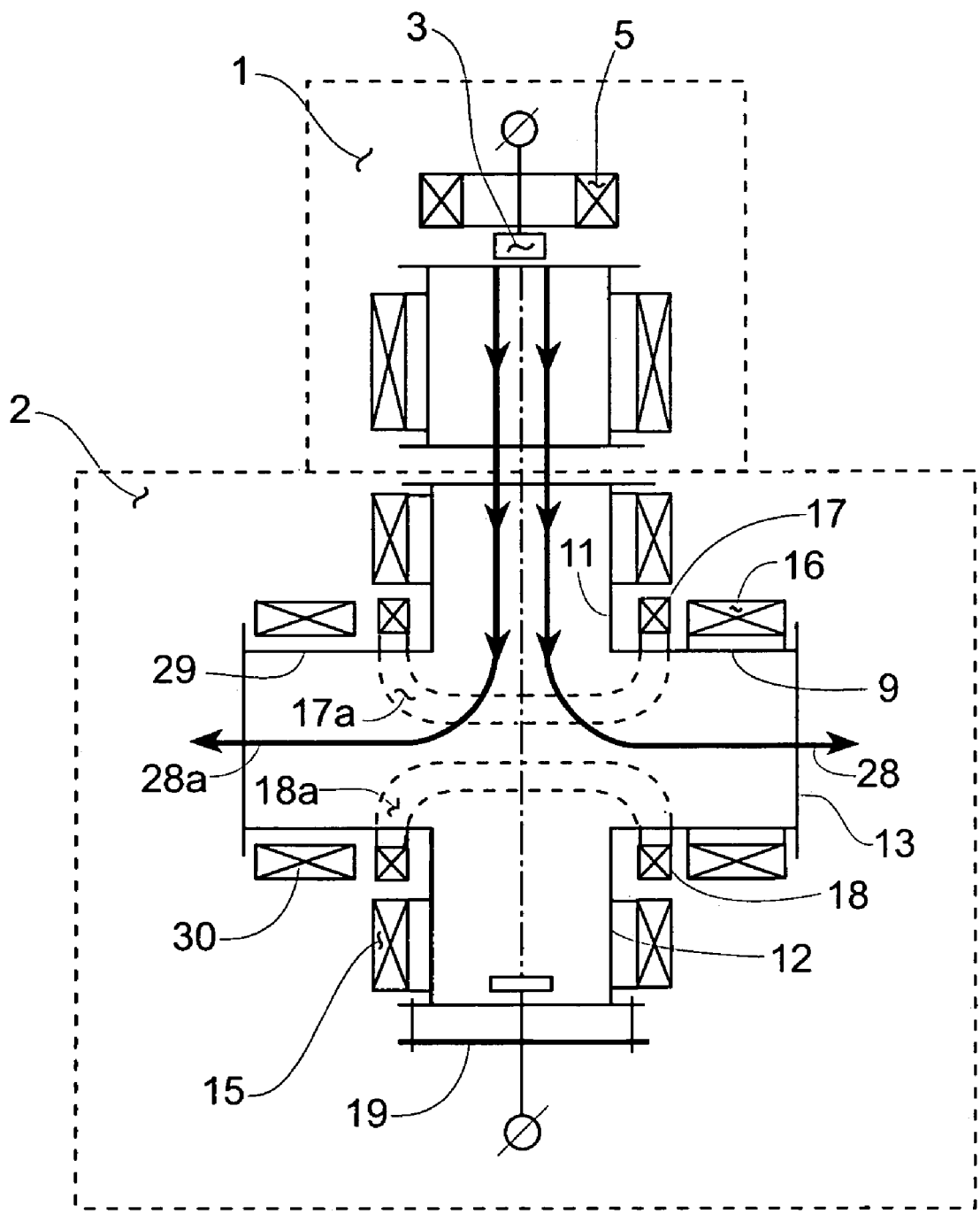
FIG. 9a shows the FIG. 1 plasma source with a second output plasma duct and second output plasma flow.
Figure 9B:
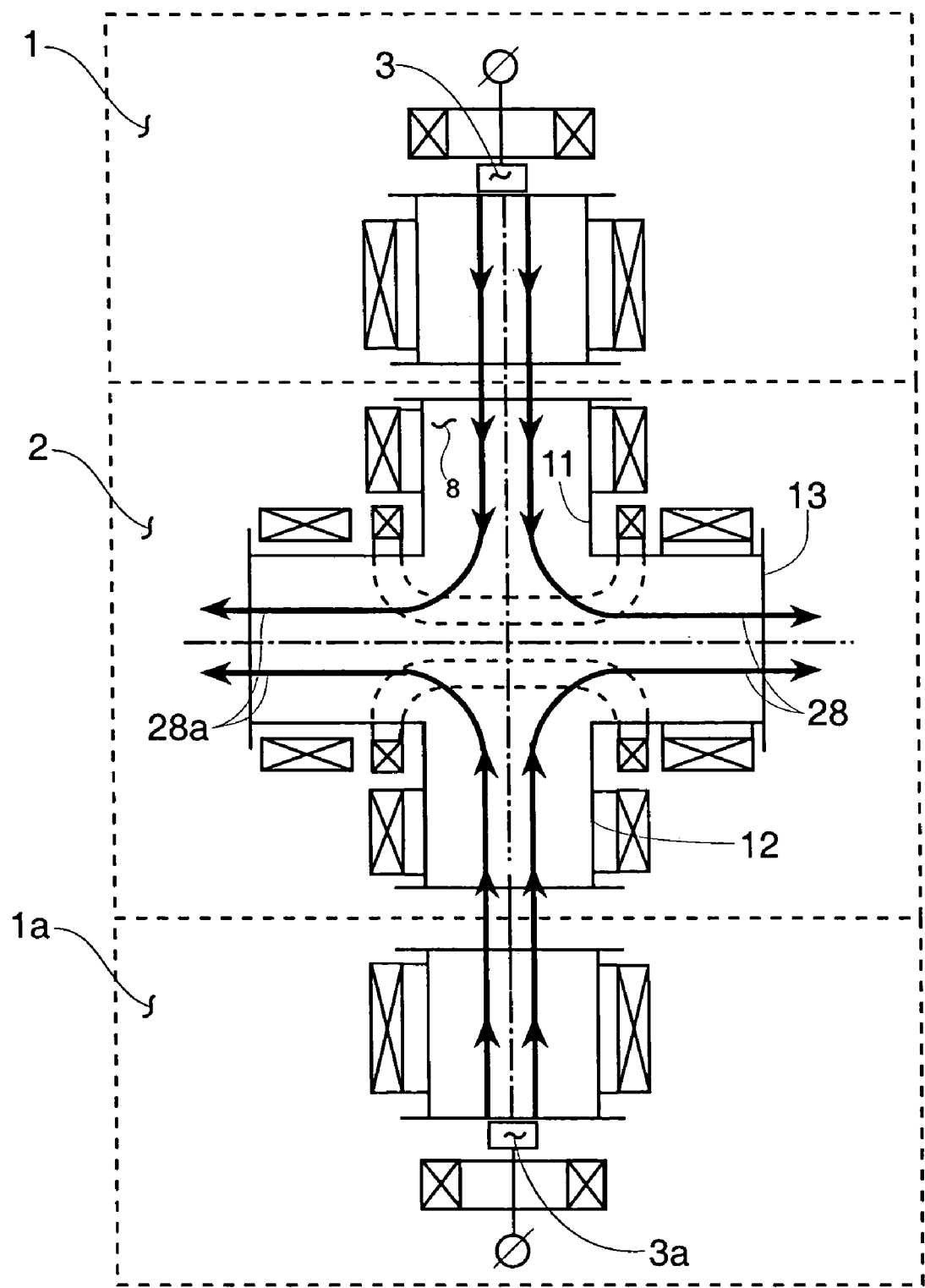
FIG. 9b shows the FIG. 9a apparatus with a second input plasma generator.

Another arrangement of a filtered cathodic-arc plasma source according to the present invention, shown in FIG. 9a, comprises an additional plasma duct 29 connected to the input plasma duct 8 opposite the output plasma duct 9 and disposed coaxially with the output plasma duct 9. In this case, the portions 17a and 18a of coils 17 and 18 adjacent the additional plasma duct 29 are also bent back in opposite flare directions so that each of them attends the additional plasma duct 29 in the same manner as for the duct 9. The additional plasma duct 29 is provided with an output duct entrance magnetic coil 30 connected to a power supply in such a way that its magnetic field is directed opposite to the field of the output magnetic coil 16. The FIG. 9a plasma source makes it possible to form two filtered cathodic-arc plasma flows disposed in opposite directions. Plasma flows are indicated in FIG. 9a by arrows 28 and 28a. In FIG. 9b a second plasma generator 1a is connected to the second end of plasma duct 8 instead of the cover 19 and electrode 20 making it possible to form two flows of two-component plasma with a modified FIG. 9a apparatus.

Figure 9C:
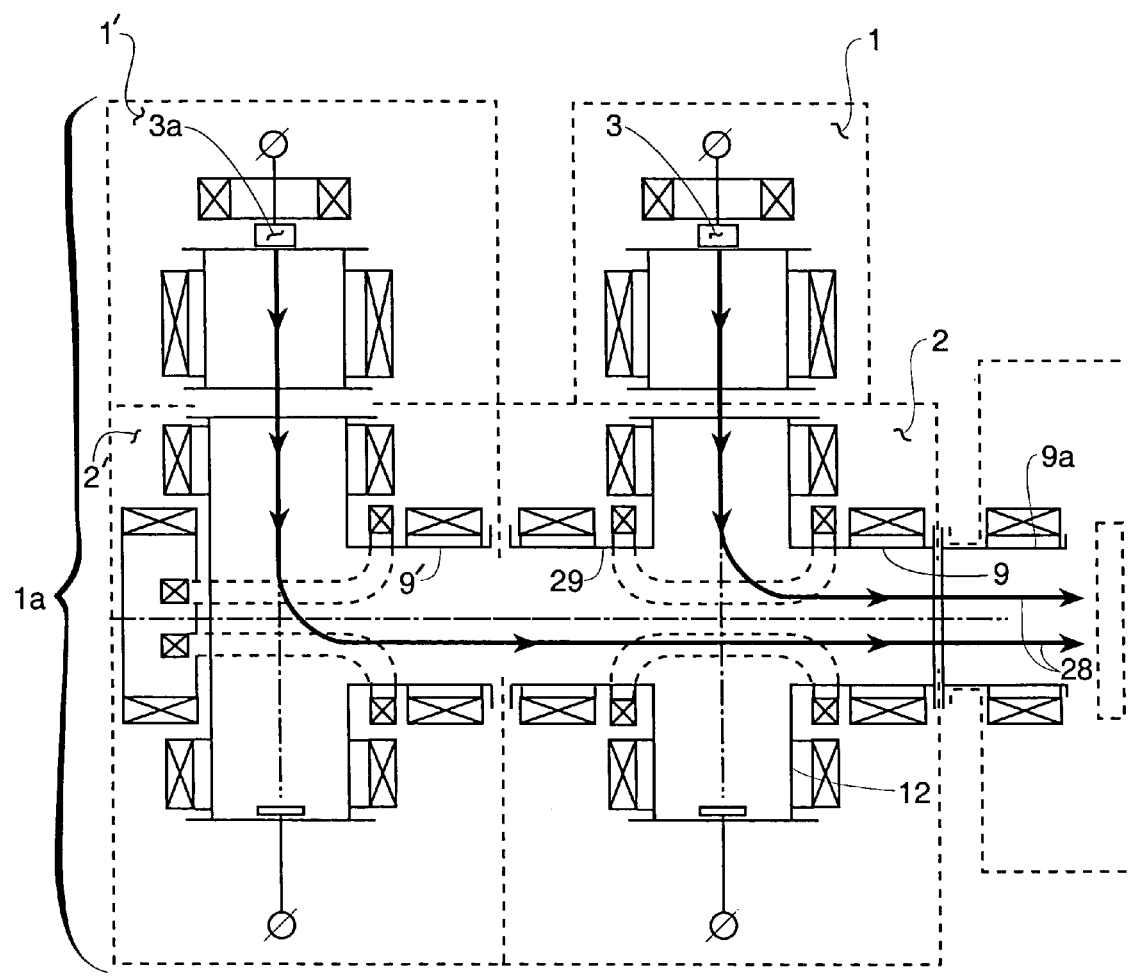
FIG. 9c shows the FIG. 9a apparatus with a connected second filtered plasma source.

A further arrangement of the FIG. 9a filtered cathodic-arc plasma source with an additional plasma duct is schematically illustrated in FIG. 9c. Here, the end of the additional plasma duct 29 is connected with a second filtered cathodic-arc plasma source 1a of the FIG. 1 type. The FIG. 9c source also provides a flow of filtered two-component plasma. Unlike the above-considered FIGS. 8 and 9b two component sources however, the FIG. 9c plasma source precludes the possibility of transporting material from one cathode onto the other cathode in the form of macroparticles--because between the cathodes 3 and 3a of generators 1 and 1', respectively, there is no direct line-of-sight. This feature of the FIG. 9c plasma source permits its use as a source of both gas and metal plasmas for example for performing the so-called duplex treatment of materials. In such duplex treatment a treating of the article or work piece by gas plasma (i.e., ion etching, nitriding, plasma-immersion ion implantation, etc.) is combined with deposition of a coating through condensation from a metal plasma. The gas plasma is generated by an arc discharge burning in one of the plasma generators, e.g., in the generator 1' in FIG. 9c at a working gas pressure of about $10^{-1}$ Pa and higher, with the auxiliary anode in the vacuum chamber (not shown in the drawing) and with the magnetic coils of the filter 2' deactivated.

A lengthening section 9a of the output plasma duct 9 appears again in the FIG. 9c drawing. In the FIG. 9c plasma source this lengthening section may also serve as the auxiliary anode. In this case, the space inside the plasma ducts and in the vacuum chamber is filled with a gas plasma, while the metal plasma components emitted by the cathode spots of the arc in the generator 1' are scattered by the gas target in the plasma-guiding channel and fail to reach the exit port of the system. While on the subject of lengthening sections it is interesting to note that the lengthening sections in the FIG. 1 and FIG. 5 illustrated plasma sources are disposed in different locations with respect to the substrate or work piece 34 and its surrounding vacuum chamber 39. In the FIG. 5 drawing the lengthening section 9a is actually located within the vacuum chamber 39 rather than being a part of the plasma source structure. This FIG. 5 location is considered useful when distances within the chamber are of greatest concern.

Figure 10:
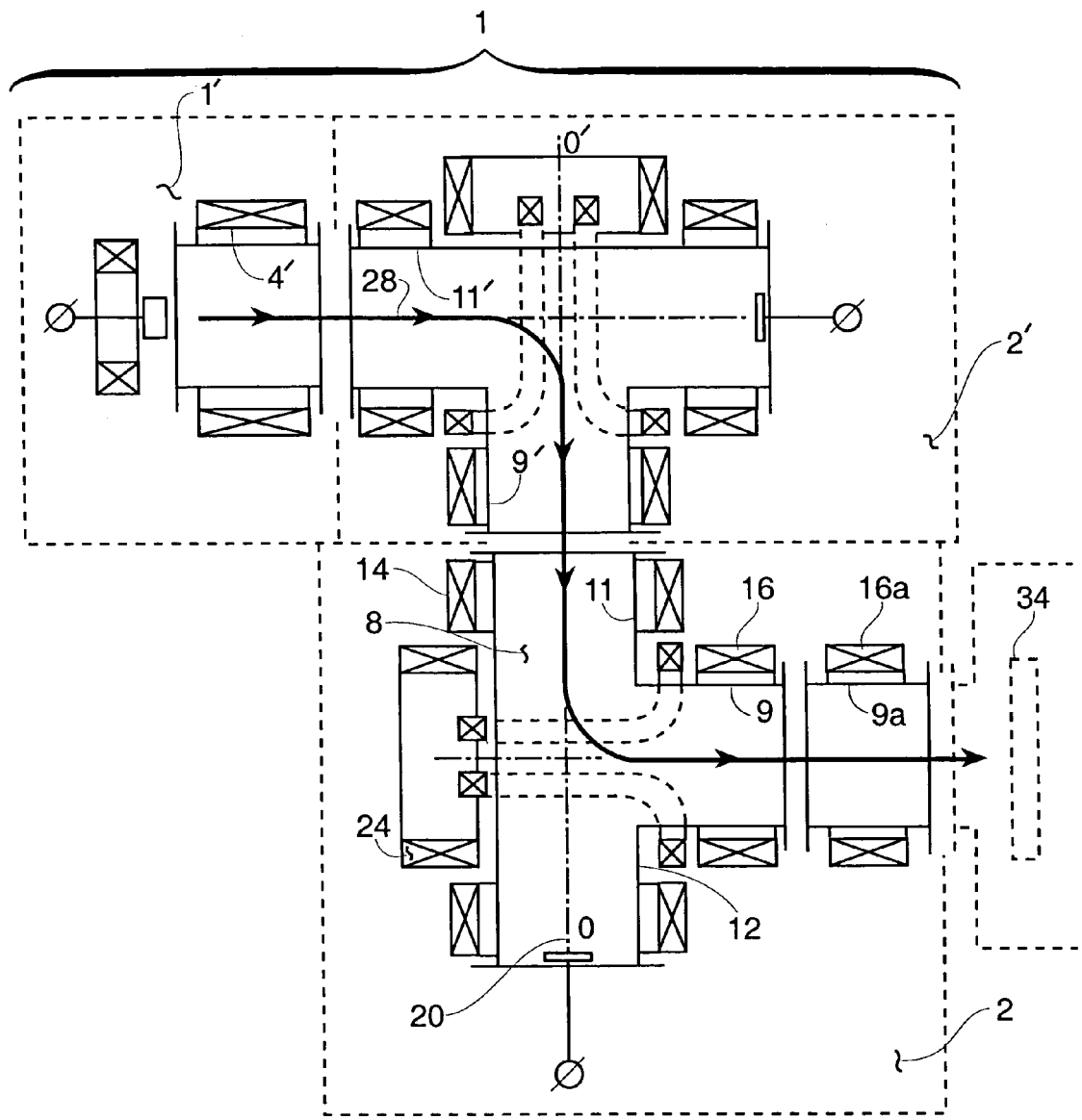
FIG. 10 shows the FIG. 1 plasma source with a second filtered plasma source used as a plasma generator.

A further arrangement of the present invention cathodic-arc plasma source is illustrated in FIG. 10. Here, the input plasma duct 8 of filter 2 is connected with a filtered cathodic-arc plasma source 1 that serves as a plasma generator made in accordance with the schematic drawing shown in FIG. 5. The plasma source 1 with the generator 1' and filter 2' is connected via its output plasma duct 9' to the first section 11 of the input plasma duct 8 of filter 2. Thus, the plasma source as a whole comprises two series-connected filters 2' and 2. Here, the overall plasma-guiding channel consists of the parts: 4', 11', 9', 11, 9, and 9(a). The FIG. 10 plasma flow 28 on its way along the overall channel twice experiences a 90° turn: between 11' and 9', and also between 11 and 9. The advantages of the filter having the FIG. 10 plasma channel include a higher degree of removing macroparticles from the output plasma. The plasma duct 8 of the filter 2 in the source shown in FIG. 10 can be connected with one more filtered cathodic-arc plasma sources. In particular, just as the first source 1 connects to the section 11 of the plasma duct 8, so a second source connected to section 12 of the plasma duct 8 may be of the arrangements illustrated in the FIG. 5 or FIG. 8 drawings.

Figure 11:
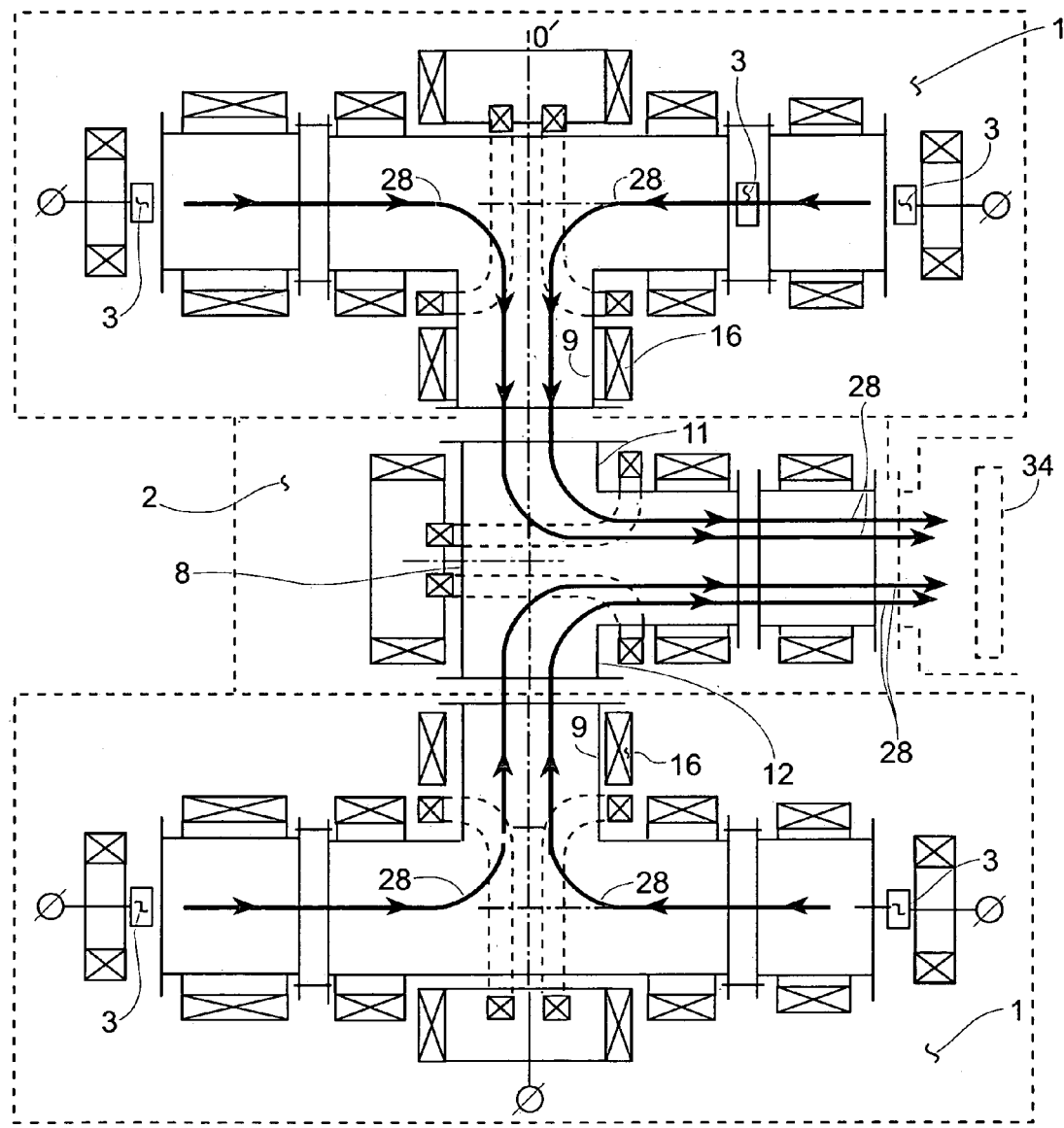
FIG. 11 shows the FIG. 1 plasma source with four filtered plasma sources and a common output plasma duct.

FIG. 11 in the drawings shows a schematic drawing of an apparatus wherein plasma sources made in accordance with FIG. 8 serve as plasma generators 1 connecting to the ends of sections 11 and 12 of the plasma duct 8. The apparatus shown in FIG. 11 makes it possible to form a flow of multi-component plasma with a high degree of removal of macroparticles. The output flow may include up to four components, each being plasma of the material of one of the four cathodes 3. Arrows 28 show the direction of plasma motion from each cathode to the exit of the system. Each of the four flow components in FIG. 11 experiences two turns through 90°, thereby providing a high degree of removing the macroparticles from plasma. With alternate initiation of discharges in each plasma generator by an assignment program the FIG. 11 system provides an ability to deposit multilayer coatings wherein each layer comprises films ranging from one to four materials during a given coating sequence.

It should be noted that in the version of the present invention source presented in FIG. 10 the planes in which the bends of the plasma-guiding channel at the joints of sections 11' and 9' of filter 2' and of sections 11 and 9 of filter 2 may be coincident planes or non coincident planes. This same concept applies to the sources shown in FIG. 11, i.e., the planes of plasma generators 1 and filter 2 may either coincide or not. The acceptable angular displacement of the joints with respect to each other around the axis 00' may be any angle within the range of ±180°. This angle of displacement may be chosen in view of convenience considerations of the linkage of the system as a whole when arranging it for a specific task.

As mentioned above, a reduction in the kinetic ion energy in the plasma generated by the present invention appears to be advantageous during the deposition of coatings onto a substrate sensitive to the action of high-energy particle flows. If, however, the plasma sources of FIG. 1 or FIG. 5 are intended for use in processes calling for higher plasma ion energy, then it is desirable to realize the aiding contribution of magnetic coils 14, 15, 17 and 18 in the filter 2. FIG. 6b in the drawings shows the result of such an aiding connection of magnetic coils 14, 15, 17 and 18. In this case a nearly uniform magnetic field intensity cross sectional distribution is attained, and the field gradient in the system is minimum. This, in turn, aids in reducing the gradient drift of the plasma, in decreasing plasma losses due to this drift, and hence in improving the conditions for plasma passage along the filter. Using the FIG. 6b configuration of the magnetic coils in the arrangement of FIG. 5 and connecting an output duct entrance coil 24 in aiding with the output coil 16 enhances this effect. Unlike the other arrangements of the invention, the aiding configuration of FIG. 6b has no magnetic field minimum zone with zero in its centre where the ions could partially lose their kinetic energy, and so the plasma ion component preserves its initial kinetic energy when passing through the plasma guiding channel.

The described cylindrical shape and circular cross section of the cathode and anode of the plasma generator, and also of plasma ducts of the filter in the plasma source should be considered only as one of several possible shapes. The described cylindrical shape appears the easiest and most convenient in the manufacture of the system. It is not inconceivable however that in other arrangements of the present invention source the shape of its components (cathode, anode, plasma ducts) may be rectangular or some other shape. The arrangement of the plasma source with rectangular shaping of its components appears advantageous when using it for the treatment of large-size products, for depositing coatings onto sheet and roll materials for example.

It should also be noted that the plasma source of the present invention may operate not only in a direct current regime but in a pulsed regime as well.

EXAMPLES

A test model of the present invention filtered cathodic-arc plasma source according to the arrangement shown in FIG. 5 may be considered as exemplary. In this source the cathode 3 of plasma generator 1 may be a cylinder, 60 millimeters in diameter of Titanium cathode material. The non-working end of the cathode, the anode and the plasma ducts are preferably cooled with water. The anode and all plasma ducts may be made from a nonmagnetic stainless steel. The inner diameter of anode 4 and plasma ducts 8 and 9 may be 190 millimeters. The anode length may be 200 millimeters and the length of each of plasma-guiding channel element 11, 12, 9, 9a made 190 millimeters. The number of Ampere-turns in the magnetic coils of the system may be such as provide the magnetic field distribution shown in FIG. 6 at a field intensity of 50 Oersteds on the axis of the output plasma duct 9. Typical Ampere-turns characteristics for the magnetic coils 5, 6, 14, 15, 16, 16a, 17, 18 and 24 are 2000, 1000, 800, 800, 700, 700, 500, 500 and 800 respectively.

Figure 12:
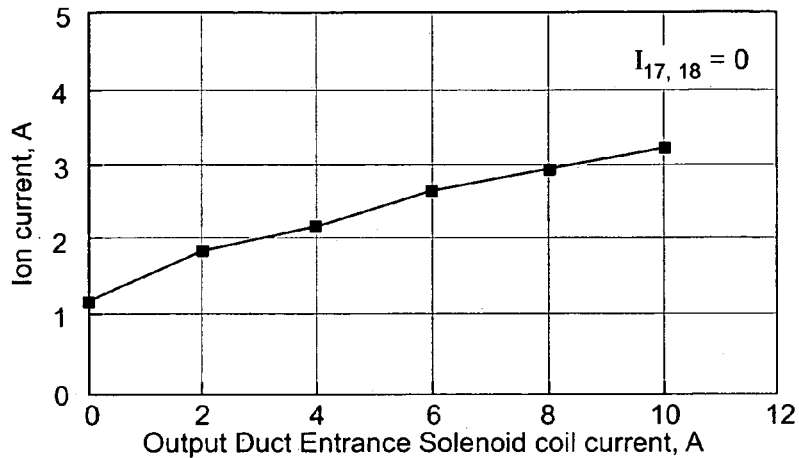
FIG. 12 shows the influence of output duct entrance magnetic coil 24 current on the output ion current of the FIG. 1 apparatus.
Figure 13:
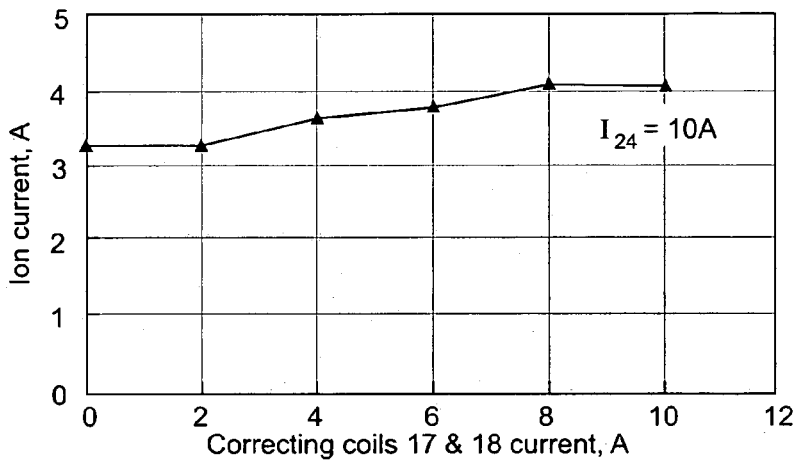
FIG. 13 shows the influence of correcting magnetic coils 17 and 18 current on the output ion current of the FIG. 1 apparatus.
Figure 14:
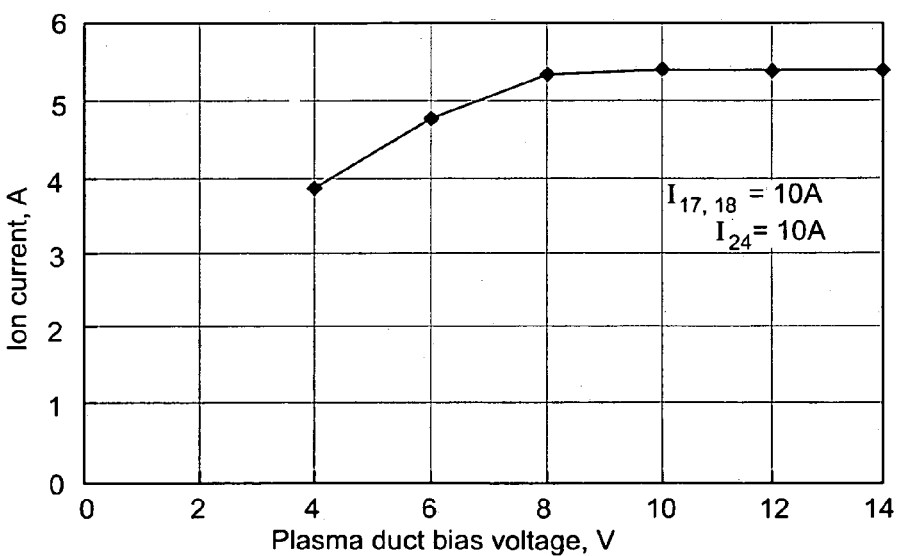
FIG. 14 shows the influence of plasma duct positive bias voltage on the output ion current of the FIG. 1 apparatus.

The influence of currents in the output duct entrance magnetic coil ($I_{24}$) and correcting magnetic coils ($I_{17, 18}$) on the output ion current value of the source, as well as the influence of bias voltage across the plasma ducts on the output ion current is shown in FIGS. 12 through 14 of the drawings. The ion currents represented in these drawings may be measured with a collector electrode using an arc current of 110 Amperes. The magnetic coil currents shown in FIG. 12 and FIG. 13 may be assumed to flow in windings having 150 turns of wire. The input ion current 1 as may be measured with a collector electrode at the entrance of filter 2, is about 8 Amperes. Hence the ion transmission efficiency defined as the ratio of output ion current to input ion current reaches 67% in the FIG. 10 instance. From the data presented it may be observed that the described filtered cathodic-arc plasma source more than twice outperforms similar-purpose known devices in the efficiency of plasma ion component transported through the filter.

A facility equipped with the described plasma source provides a deposition of coatings free of macroparticles for cathodes made of titanium and aluminum. Titanium coatings are obtained at a residual gas pressure of about $5 \cdot 10^{-4}$ Pascals. The rate of coating deposition is about 10 micrometers per hour. Polished stainless steel plates may be used as a test substrate. Titanium nitride coatings deposited in a 1/1 nitrogen—argon mixture with coatings up to 10 micrometers in thickness may be obtained with a deposition rate of up to 20 micrometers per hour. The microhardness of the condensate is estimated to be 27 GigaPascals.

Transparent $Al_2O_3$ films may be obtained using the invention by deposition of Aluminum plasma onto a glass plate in an atmosphere of oxygen (80 atmospheric %) mixed with argon using the present invention. Film thickness between 4 and 6 micrometers and a deposition rate of about 6 micrometers per hour prevail. Aluminum oxides and nitrides are synthesized using a high-purity aluminum cathode (impurities no more than 0.01%) with a supply of high frequency, 1 megahertz and about 50 Volt amplitude, electrical potential applied to the substrate. Aluminum nitride in the form of a transparent film of up to 1 micrometer thickness on spectacle plastic lenses can be synthesized through condensation of Al plasma in the nitrogen atmosphere. The coefficient of light transmission in the visible spectrum is about 94% for this material; this provides evidence of a high degree of removal of macroparticles from the plasma.

Diamond-like carbon (DLC) coatings may also be deposited on stainless steel plates, using high purity graphite as a cathode material. A 5 MegaHertz high frequency alternating current potential of about 100 volts is preferably supplied between the plates and the grounded vacuum chamber walls during the processing. Argon is used as a working gas at a pressure of about 0.07 Pascals. The rate of deposition is about 4 to 14 micrometers per hour. The homogeneous coatings are produced in an area of about 15 cm². The micro-hardness of the achieved DLC coating is about 70 to 80 GigaPascals.

It is perhaps worth noting that the present invention plasma source with its output of electrons and positively charged ion particles is distinguishable from the somewhat related apparatus that is known in the art as an "ion source". Actually a true "ion source" is quite another category of apparatus, an apparatus emitting a beam of only ions and such apparatus involves additional particle exclusion elements not employed in the present invention.

While the apparatus and method herein described constitute a preferred embodiment of the invention, it is to be understood that the invention is not limited to this precise form of apparatus or method and that changes may be made therein without departing from the scope of the invention, which is defined in the appended claims.

What is claimed is:

1. In a filtered cathodic-arc plasma source having:
    a consumable cathode with an end working surface emitting cathode-material plasma in response to vacuum arc engagement;
    a tubular anode adjacent and coaxial with said consumable cathode cathodic and anodic plasma focusing magnetic coils surrounding said consumable cathode and said tubular anode respectively;
    said consumable cathode, tubular anode and focusing magnetic coils comprising a first plasma generator;
    a plasma filter disposed in communication with said first plasma generator and including input and output rectilinear plasma ducts each surrounded by direct current magnetic coils;
    said plasma ducts and said plasma generator anode comprising a plasma-guiding channel having at least one exit opening and having a channel configuration exclusive of direct line-of-sight plasma communication between said plasma generator cathode and said exit opening; and electrical energy power supplies for said vacuum arc and said magnetic coils; the improvement comprising:

said input and output rectilinear plasma ducts connect in a right angle junction wherein a wall opening in said input plasma duct enables plasma communication between said input and output rectilinear plasma ducts;

said direct current magnetic coils surrounding said input and output rectilinear plasma ducts are supplemented by first and second magnetic field lines adjustment magnetic coils disposed around said input and output rectilinear plasma ducts at said right angle junction and energized by electrical energy power supplies; and said electrical energy power supplies for said direct current magnetic coils surrounding said input and output rectilinear plasma ducts and for said magnetic field lines adjustment magnetic coils include magnetic field adjustment means for configuring magnetic field lines within said output plasma duct as smooth, plasma conveying, low plasma loss continuations of magnetic field lines within said input plasma duct.

2. The filtered cathodic-arc plasma source of claim 1 wherein said first and second magnetic field lines adjustment magnetic coils each include a first circular portion disposed around said input rectilinear plasma duct and a second flared portion residing substantially orthogonal to said first circular portion and disposed around said output rectilinear plasma duct.

3. The filtered cathodic-arc plasma source of claim 1 further including an output duct entrance magnetic coil in coaxial disposition with said output plasma duct on an opposed lateral surface of said input plasma duct from said output plasma duct and wherein electrical current generating an opposed magnetic polarity flows in windings of said output duct entrance magnetic coil and said output rectilinear plasma duct direct current magnetic coil.

4. The filtered cathodic-arc plasma source of claim 3 wherein said output duct entrance magnetic coil has an inside diameter intermediate an outside diameter of said input duct and a length dimension of said input duct.

5. The filtered cathodic-arc plasma source of claim 1, wherein said direct current magnetic coils surrounding said input rectilinear plasma duct comprise a first plasma input duct magnetic coil disposed adjacent an open ended entrance portion of said input rectilinear plasma duct and a second plasma input duct magnetic coil disposed adjacent a distal closed end particle trap portion of said input rectilinear plasma duct.

6. The filtered cathodic-arc plasma source of claim 1 wherein electrical current generating a same magnetic polarity flows in said first magnetic field lines adjustment magnetic coil and said first plasma input duct magnetic coil and electrical current generating an opposed magnetic polarity flows in both winding turns of said second magnetic field lines adjustment magnetic coil and said second plasma input duct magnetic coil.

7. The filtered cathodic-arc plasma source of claim 1 wherein said input rectilinear plasma duct further includes an electrically isolated plasma component collecting electrode element distally located with respect to said tubular anode element and in a closed end portion of said input rectilinear plasma duct.

8. The filtered cathodic-arc plasma source of claim 1 further including a second plasma generator apparatus connected to said input plasma duct at an end thereof distal to said first plasma generator apparatus.

9. The filtered cathodic-arc plasma source of claim 1 wherein said wall opening in said input plasma duct comprises a circumferential slit covered by an electrically insulated screen and wherein said circumferential slit and said electrical insulated screen are disposed in coincidence with a magnetic.cusp trap zone generated by magnetic coil fields within said input and output ducts.

10. The filtered cathodic-arc plasma source of claim 1 wherein electrical current generating a same magnetic polarity flows in said first magnetic field lines adjustment magnetic coil and said first plasma input duct magnetic coil and electrical current generating same magnetic polarities flows in windings of said output duct entrance magnetic coil and said output rectilinear plasma duct direct current magnetic coil.

11. The filtered cathodic-arc plasma source of claim 1 wherein said plasma-guiding channel plasma ducts further include circumferentially disposed internal fin member particle trapping elements.

12. The method of generating filtered high quality cathodic-arc plasma comprising the steps of:

disposing a cathodic arc source of electrons, ions and other plasma components within an evacuation chamber contiguously connecting with a right angle bend-inclusive plasma magnetic filter apparatus;

establishing a curvilinear pattern of plasma flow controlling equipotential magnetic flux lines within said right angle bend-inclusive plasma magnetic filter apparatus using a plurality of surrounding electrical magnetic elements received in selected right-angle bend-removed locations of said plasma magnetic filter apparatus; and enhancing said curvilinear pattern of plasma flow controlling magnetic flux lines within said right angle bend-inclusive plasma magnetic filter apparatus by adding output duct entrance magnetic coil and corrective magnetic element magnetic fluxes to said curvilinear pattern;

said output duct entrance magnetic coil and corrective magnetic coil element magnetic fluxes limiting losses from a flow of selected plasma components traversing said filter apparatus along said magnetic flux lines;

said enhancing and limiting steps including altering said established equipotential flux lines with supplementing magnetic flux received from output duct entrance magnetic coil and multi planar corrective magnetic coil element flux sources of selected flux configuration and flux magnitude disposed adjacent said right angle bend of said filter apparatus.

13. The method of generating filtered high quality cathodic-arc plasma of claim 12 wherein said enhancing and limiting steps further include reducing sidewall collision events in said right angle bend-inclusive plasma magnetic filter apparatus.

14. The method of generating filtered high quality cathodic-arc plasma of claim 12 wherein said step of enhancing said flow of selected plasma components through said filter apparatus include selecting said magnetic fluxes in response to generating an enhanced flow of electrons through said filter apparatus and generating an enhanced flow of plasma components attracted to said enhanced electron flow.

15. The method of generating filtered high quality cathodic-arc plasma of claim 12 wherein said step of enhancing said curvilinear pattern of plasma flow controlling magnetic flux lines within said right angle bend-inclusive plasma magnetic filter apparatus and a flow of selected plasma components through said filter apparatus includes establishing magnetic flux magnitudes within said magnetic filter apparatus wherein:
  a Larmour radius characteristic of electrons in said flowing plasma electrons is selected to be much less than a radius dimension of an enclosing duct member of said plasma magnetic filter apparatus, and
  a Larmour radius characteristic of ions in said flowing plasma ions is controlled to be greater than said radius dimension of an enclosing duct member of said plasma magnetic filter apparatus.

16. A purified cathodic arc plasma generator comprising the combination of:
  cathode arc particle generating apparatus;
  magnetic particle segregation apparatus disposed in particle axial communication with said cathode arc particle generating apparatus and including a right angle bend portion connecting input and output path portions along a path of particle axial communication;
  said magnetic particle segregation apparatus including a first plurality of electromagnetic field generating elements disposed along said input and output portions of said path of particle axial communication in locations distal of said particle path right angle bend portion; and
  a second plurality of electromagnetic field generating elements disposed along said path of particle axial communication in locations adjacent said particle path right angle bend;
  said second plurality of electromagnetic field generating elements including a magnetic coil disposed adjacent said input portion of said path of particle axial communication at said right angle bend and in coaxial alignment with said output portion of said path of particle axial communication;
  said second plurality of electromagnetic field generating elements also including a pair of saddle shaped magnetic coils surrounding said input portion and adjacent said output portion of said path of particle axial communication in locations immediately preceding and immediately succeeding said right angle bend.

17. The purified cathodic arc plasma generator of claim 16 wherein said cathode arc particle generating apparatus includes first and second cathodic-arc plasma generators disposed in particle axial communication with a portion of said magnetic particle segregation apparatus.

18. The purified cathodic arc plasma generator of claim 17 wherein said cathode arc particle generating apparatus includes third and fourth cathodic-arc plasma generators disposed in particle axial communication with a selected portion of said magnetic particle segregation apparatus.

19. The purified cathodic arc plasma generator of claim 18 wherein said cathode arc particle generating apparatus include a plurality of differing cathode materials.

20. The purified cathodic arc plasma generator of claim 16 further including a plurality of said magnetic particle segregation apparatus output portions disposed in axial alignment along, and in orthogonal disposition with, said magnetic particle segregation apparatus input portion.

21. The purified cathodic arc plasma generator of claim 16 further including a supplemental magnetic coil-attended lengthening section connected with said magnetic particle segregation apparatus output portion at an output port thereof.

22. The purified cathodic arc plasma generator of claim 16 wherein said particle axial communication includes particle electron and ion motions within a Larmour radii range of $\rho_e \ll \alpha < \rho_i$ where $\rho_e$ and $\rho_i$ are, Larmour radius of electrons and Larmour radius of ions respectively and a is a radius of a particle conveying duct in said particle segregation apparatus.

23. The purified cathodic arc plasma generator of claim 22 wherein said magnetic particle segregation apparatus first plurality of electromagnetic field generating elements are characterized by generation of magnetic field intensities enabling said Larmour radii range of $\rho_e \ll \alpha < \rho_i$.

24. Purified cathodic arc plasma source apparatus comprising the combination of:
  a cathode arc source of electrons, ions and additional cathode arc generated particles;
  an input duct element disposed in axial communication with said cathode arc source of electrons, ions and additional cathode arc generated particles;
  a first input duct electrical magnetic coil disposed surrounding said input duct element and energized by a source of selected magnitude electrical energy;
  an output duct element disposed in substantially orthogonal communication with a downstream portion of said input duct element and with input duct element electrons and ions influenced by said first input duct electrical magnetic coil;
  an output electrical magnetic coil disposed surrounding said output duct element and energized by a source of selected magnitude electrical energy;
  a second input duct electrical magnetic coil disposed surrounding said input duct element in an input duct location downstream of said output duct element and energized by a source of selected magnitude electrical energy;
  a first saddle shaped ion path correcting magnetic coil disposed surrounding said input duct element in a downstream location preceding said output duct element and partially surrounding said output duct element adjacent said input duct element and energized by a source of selected magnitude electrical energy; and
  a second saddle shaped ion path correcting magnetic coil disposed surrounding said input duct element in a downstream location succeeding said output duct element and partially surrounding said output duct element adjacent said input duct element and energized by a source of selected magnitude electrical energy.

25. The purified cathodic arc plasma source apparatus of claim 24 further including a output duct entrance magnetic coil coaxially disposed with respect to said output duct element on an opposed side of said input duct element with respect to said output duct element and energized by a source of selected magnitude electrical energy.

26. The purified cathodic arc plasma source apparatus of claim 24 further including an electron collection electrode located in an input duct downstream location succeeding said output duct element and said correcting magnetic coils and adjacent said second input duct electrical magnetic coil.

27. The purified cathodic arc plasma source apparatus of claim 24 further including an output duct port located at an end of said output duct element distal of said input duct element and wherein said substantially orthogonal input duct element to output duct element communication includes a curved path exclusive of line of sight communication between a cathode in said cathode arc source and said output duct port.

28. The purified cathodic arc plasma source apparatus of claim 27 further including an energized supplemental magnetic coil attended output duct element extension member disposed intermediate said output duct element and said output duct port.

29. The purified cathodic arc plasma source apparatus of claim 24 further including a screen covered slit aperture located in said input duct element and opening into said output duct element and wherein said slit aperture is disposed in coincidence with a magnetic flux pattern defined cusp region within said input and output duct elements.

30. The purified cathodic arc plasma source apparatus of claim 24 wherein said sources of selected magnitude electrical energy are direct current electrical energy sources.

31. The purified cathodic arc plasma source apparatus of claim 24 wherein said cathode arc source of electrons is energized by one of a direct current electrical energy source and a pulsed electrical energy source.

* * * * *